United States Patent
Stoessel et al.

(10) Patent No.: US 10,615,343 B2
(45) Date of Patent: *Apr. 7, 2020

(54) FORMULATIONS AND ELECTRONIC DEVICES

(71) Applicant: Merck Patent GmbH, Darmstadt (DE)

(72) Inventors: Philipp Stoessel, Frankfurt am Main (DE); Irina Martynova, Griesheim (DE); Aurélie Ludemann, Franfurt am Main (DE); Edgar Kluge, Gross-Gerau (DE); Nils Koenen, Darmstadt (DE)

(73) Assignee: Merck Patent GmbH (DE)

( * ) Notice: Subject to any disclaimer, the term of this patent is extended or adjusted under 35 U.S.C. 154(b) by 175 days.

This patent is subject to a terminal disclaimer.

(21) Appl. No.: 15/508,366

(22) PCT Filed: Aug. 4, 2015

(86) PCT No.: PCT/EP2015/001601
§ 371 (c)(1),
(2) Date: Mar. 2, 2017

(87) PCT Pub. No.: WO2016/034262
PCT Pub. Date: Mar. 10, 2016

(65) Prior Publication Data
US 2017/0294582 A1 Oct. 12, 2017

(30) Foreign Application Priority Data
Sep. 5, 2014 (EP) .................................... 14003076

(51) Int. Cl.
| | | |
|---|---|---|
| *H01L 51/00* | (2006.01) | |
| *C09K 19/34* | (2006.01) | |
| *C09K 11/02* | (2006.01) | |
| *C09K 11/06* | (2006.01) | |
| *H01L 51/50* | (2006.01) | |

(52) U.S. Cl.
CPC ........ *H01L 51/0007* (2013.01); *C09K 11/025* (2013.01); *C09K 11/06* (2013.01); *C09K 19/3441* (2013.01); *H01L 51/0037* (2013.01); *H01L 51/0052* (2013.01); *H01L 51/0056* (2013.01); *H01L 51/0067* (2013.01); *H01L 51/0077* (2013.01); *H01L 51/0085* (2013.01); *C09K 2211/1007* (2013.01); *C09K 2211/1029* (2013.01); *C09K 2211/185* (2013.01); *H01L 51/0005* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/5384* (2013.01); *Y02E 10/549* (2013.01)

(58) Field of Classification Search
CPC ............ H01L 51/0007; H01L 51/0052; H01L 51/0056; H01L 51/0077; H01L 51/0067; H01L 51/0085; H01L 51/0037; H01L 51/5088; H01L 51/5092; H01L 51/5056; H01L 51/5096; H01L 51/0005; H01L 51/5072; H01L 2251/5384; H01L 51/5016; C09K 11/025; C09K 11/06; C09K 19/3441; C09K 2211/1007; C09K 2211/1029; C09K 2211/185; Y02E 10/549
USPC ........................................................ 252/500
See application file for complete search history.

(56) References Cited

U.S. PATENT DOCUMENTS

| | | | |
|---|---|---|---|
| 8,343,637 B2 * | 1/2013 | Parham | C07D 209/80 313/504 |
| 9,837,622 B2 * | 12/2017 | Stoessel | H01L 51/0085 |
| 2007/0254185 A1 | 11/2007 | Uchino et al. | |
| 2008/0220285 A1 * | 9/2008 | Vestweber | C07C 13/62 428/690 |
| 2009/0302752 A1 * | 12/2009 | Parham | C07D 209/80 313/504 |
| 2013/0069020 A1 | 3/2013 | May et al. | |
| 2013/0316279 A1 | 11/2013 | Imura et al. | |
| 2015/0105564 A1 * | 4/2015 | Adachi | C07D 209/18 548/440 |
| 2015/0171348 A1 * | 6/2015 | Stoessel | C07F 15/0033 252/301.16 |
| 2015/0263297 A1 * | 9/2015 | Stoessel | H01L 51/0085 252/301.16 |
| 2015/0270500 A1 * | 9/2015 | Stoessel | H01L 51/0094 252/301.35 |
| 2015/0318498 A1 * | 11/2015 | Stoessel | C09K 11/06 252/301.16 |

FOREIGN PATENT DOCUMENTS

| | | | | |
|---|---|---|---|---|
| JP | 2007281386 A | 10/2007 | | |
| JP | 2013533606 A | 8/2013 | | |
| JP | 2013245232 A | 12/2013 | | |
| WO | WO-2013029733 A1 | 3/2013 | | |
| WO | WO-2014008982 A1 * | 1/2014 | ......... | H01L 51/0085 |
| WO | WO-2015070944 A1 | 5/2015 | | |

OTHER PUBLICATIONS

CAS reg. No. 91324-94-6, Nov. 16, 1984. (Year: 1984).*
International Search Report for PCT/EP2015/001601 dated Oct. 26, 2015.
Written Opinion of the International Searching Authority for PCT/EP2015/001601 dated Oct. 26, 2015.

* cited by examiner

*Primary Examiner* — Douglas J McGinty
(74) *Attorney, Agent, or Firm* — Faegre Drinker Biddle & Reath LLP

(57) ABSTRACT

The present invention relates to a formulation comprising at least one organofunctional material which can be employed for the production of functional layers of electronic devices, and at least one aromatic compound. The present invention furthermore relates to electronic devices which are obtainable from these formulations.

18 Claims, 1 Drawing Sheet

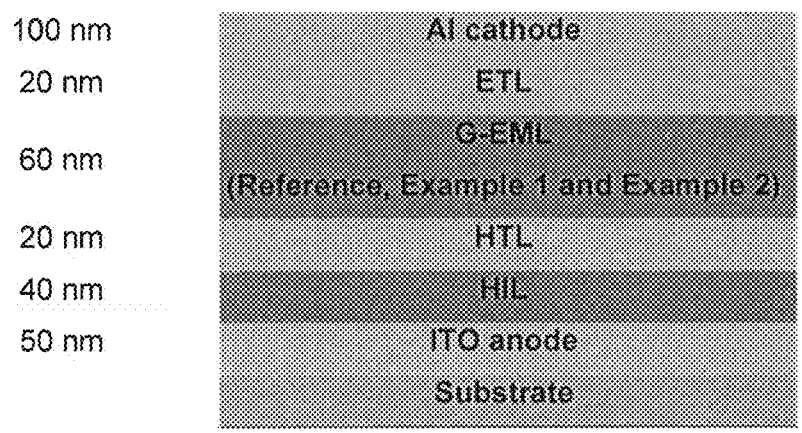
Layer sequence of the OLED test components

FORMULATIONS AND ELECTRONIC DEVICES

CROSS-REFERENCE TO RELATED APPLICATIONS

This application is a national stage application (under 35 U.S.C. § 371) of PCT/EP2015/001601, filed Aug. 4, 2015, which claims benefit of European Application No. 14003076.8, filed Sep. 5, 2014, both of which are incorporated herein by reference in their entirety.

The present invention relates to formulations for the production of electronic devices. The present invention furthermore relates to electronic devices and to a process for the production thereof.

Electronic devices which comprise organic, organometallic and/or polymeric semiconductors are increasing in importance; they are employed in many commercial products for cost reasons and owing to their performance. Examples which may be mentioned here are organic-based charge-transport materials (for example triarylamine-based hole transporters) in photocopiers, organic or polymeric light-emitting diodes (OLEDs or PLEDs) and in display devices, or organic photoreceptors in photocopiers. Organic solar cells (O-SC), organic field-effect transistors (O-FET), organic thin-film transistors (O-TFT), organic integrated circuits (O-IC), organic optical amplifiers and organic laser diodes (O-lasers) are at an advanced stage of development and may achieve major importance in the future.

Irrespective of the particular application, many of these electronic devices have the following general layer structure, which can be adapted for the particular application:
(1) substrate,
(2) electrode, frequently metallic or inorganic, but also made from organic or polymeric, conductive materials,
(3) charge-injection layer(s) or interlayer(s), for example for compensation of electrode unevenness ("planarisation layer"), frequently made from a conductive, doped polymer,
(4) organic semiconductors,
(5) optionally further charge-transport, charge-injection or charge-blocking layers,
(6) counterelectrode, materials as mentioned under (2),
(7) encapsulation, The above arrangement represents the general structure of an organic, electronic device, where various layers can be combined, resulting in the simplest case in an arrangement comprising two electrodes, between which an organic layer is located. In this case, the organic layer fulfils all functions, including the emission of light in the case of OLEDs. A system of this type is described, for example, in WO 90/13148 A1 based on poly(p-phenylenes).

However, a problem which arises in a "three-layer system" of this type is the lack of control of charge separation and/or the lack of a way of optimising the properties of the individual constituents in different layers, as is solved 0.15 in a simple manner by a multilayered structure, for example, in the case of SMOLEDs ("small-molecule OLEDs").

A small-molecule OLED often comprises one or more organic hole-injection layers, hole-transport layers, emission layers, electron-transport layers and/or electron-injection layers and an anode and a cathode, where the entire system is usually located on a glass substrate. The advantage of a multilayered structure of this type consists in that the various functions of charge injection, charge transport and emission can be distributed over the various layers and the properties of the respective layers can thus be modified separately. This modification enables the performance of the electronic devices to be considerably improved.

A disadvantage of electronic devices which are based on the small molecules described, i.e. low-molecular-weight compounds, is the production thereof. Low-molecular-weight compounds are usually converted into electronic devices by evaporation techniques. This represents a major cost disadvantage, in particular for large-area devices, since a multistep vacuum process in various chambers is very expensive and must be controlled very precisely. Less expensive and established coating methods from solution, such as, for example, ink-jet printing, airbrush methods, roll-to-roll processes, etc., would be a major advantage here.

Thus, for example, WO 2009/021107 A1 and WO 2010/006680 A1 describe organic compounds which are suitable for the production of electronic devices, where these compounds can be processed both via gas-phase deposition and also from solution. However, the electronic devices which are obtained via gas-phase deposition exhibit a more favourable property profile.

Known processes for the production of electronic devices have a usable property profile. However, it is constantly necessary to improve the properties of these processes.

In particular, the process should be inexpensive to carry out. Furthermore, the process should be suitable for the production of very small structures, enabling high-resolution screens to be obtained by the process. Furthermore, it should be possible to carry out the process using standard printing processes.

These advantages should be achieved individually or together. An essential point of view here is that the electronic devices obtainable by the process should have excellent properties.

These properties include, in particular, the lifetime of the electronic devices. A further problem is, in particular, the energy efficiency with which an electronic device achieves the specified object. In the case of organic light-emitting diodes, which may be based both on low-molecular-weight compounds and also on polymeric materials, the light yield, in particular, should be high, so that as little electrical power as possible has to be applied in order to achieve a certain light flux. Furthermore, the lowest possible voltage should also be necessary in order to achieve a specified luminous density. Accordingly, these properties should not be adversely affected by the process.

Furthermore, it should be possible to employ and/or adapt the electronic devices for many purposes. In particular, the performance of the electronic devices should be retained over a broad temperature range.

A further object can be regarded as being the provision of electronic devices having excellent performance as inexpensively as possible and in constant quality.

Surprisingly, it has been found that these objects and further objects which are not mentioned explicitly, but which can readily be derived or developed from the correlations discussed in the introduction are achieved by formulations having all features of patent Claim 1. Advantageous modifications of the formulations according to the invention are placed under protection in the claims which are dependent on Claim 1.

The present invention accordingly relates to a formulation comprising at least one organofunctional material which can be employed for the production of functional layers of electronic devices, and at least one aromatic compound having a structure of the formula (1) or (2)

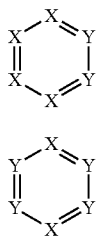

formula (1)

formula (2)

where the following applies to the symbols used:
X is on each occurrence, identically or differently, CR or N, where in total at most 2 radicals X stand for N;
R is on each occurrence, identically or differently, H, D, F, N(R$^1$)$_2$, CN, NO$_2$, C(=O)N(R$^1$)$_2$, Si(R$^1$)$_3$, C(=O)R$^1$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which may be substituted by one or more radicals R$^1$, where one or more non-adjacent CH$_2$ groups may be replaced by R$^1$C=CR$^1$, C≡C, Si(R$^1$)$_2$, C=O, NR$^1$, O, S or CONR$^1$ and where one or more H atoms may be replaced by D, F, NO$_2$ or CN, or an aromatic or heteroaromatic ring system having 5 to 60 aromatic ring atoms, which may in each case be substituted by one or more radicals R$^1$, or an aryloxy or heteroaryloxy group having 5 to 40 aromatic ring atoms, which may be substituted by one or more radicals R$^1$, or an aralkyl or heteroaralkyl group having 5 to 40 aromatic ring atoms, which may be substituted by one or more radicals R$^1$, or a diarylamino group, diheteroarylamino group or arylheteroarylamino group having 10 to 40 aromatic ring atoms, which may be substituted by one or more radicals R$^1$; two adjacent radicals R here may also form a mono- or polycyclic, aliphatic, aromatic or heteroaromatic ring system with one another;
R$^1$ is on each occurrence, identically or differently, H, D, F, N(R$^2$)$_2$, CN, NO$_2$, Si(R$^2$)$_3$, C(=O)R$^2$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which may be substituted by one or more radicals R$^2$, where one or more non-adjacent CH$_2$ groups may be replaced by R$^2$C=CR$^2$, C≡C, Si(R$^2$)$_2$, C=O, NR$^2$, O, S or CONR$^2$ and where one or more H atoms may be replaced by D, F, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 40 aromatic ring atoms, which may be substituted by one or more radicals R$^2$, or an aralkyl or heteroaralkyl group having 5 to 40 aromatic ring atoms, which may be substituted by one or more radicals R$^2$, or a diarylamino group, diheteroarylamino group or arylheteroarylamino group having 10 to 40 aromatic ring atoms, which may be substituted by one or more radicals R$^2$; two or more adjacent radicals R$^1$ with one another or R$^1$ with R here may form a mono- or polycyclic, aliphatic, aromatic or heteroaromatic ring system;
R$^2$ is on each occurrence, identically or differently, H, D, F or an aliphatic, aromatic and/or heteroaromatic hydrocarbon radical having 1 to 20 C atoms, in which, in addition, one or more H atoms may be replaced by F; two or more substituents R$^2$ here may also form a mono- or polycyclic, aliphatic ring system with one another;
Y is on each occurrence, identically or differently, a group CR,
which is characterised in that
the adjacent groups Y in the structure of the formula (1) or (2) together form a ring of one of the following formulae (3), (4), (5), (6), (7), (8) and (9):

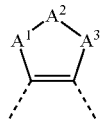

formula (3)

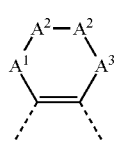

formula (4)

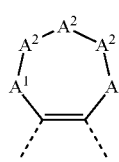

formula (5)

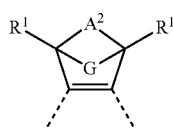

formula (6)

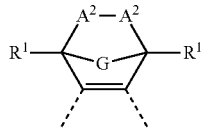

formula (7)

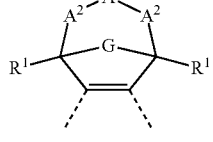

formula (8)

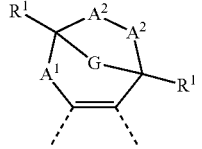

formula (9)

where R$^1$ has the meaning given above, the dashed lines represent the bonds from the two carbon atoms of group Y to the radicals X of the aromatic or heteroaromatic ring in the structure of the formula (1) or formula (2), and furthermore:
A$^1$, A$^3$ are, identically or differently on each occurrence, C(R$^3$)$_2$, O, S, NR$^3$ or C(=O);
A$^2$ is C(R$^1$)$_2$, O, S, NR$^3$ or C(=O);
G is an alkylene group having 1, 2 or 3 C atoms, which may be substituted by one or more radicals R$^2$, or is —CR$^2$=CR$^2$— or an ortho-linked arylene or heteroarylene group having 5 to 14 aromatic ring atoms, which may be substituted by one or more radicals R$^2$;
R$^3$ is, identically or differently on each occurrence, F, a straight-chain alkyl or alkoxy group having 1 to 10 C atoms, a branched or cyclic alkyl or alkoxy group having 3 to 10 C atoms, each of which may be substituted by one or more radicals $R^2$, where one or more non-adjacent $CH_2$ groups may be replaced by $R^2C=CR^2$, $C\equiv C$, $Si(R^2)_2$, $C=O$, $NR^2$, O, S or $CONR^2$ and where one or more H atoms may be replaced by D or F, or an aromatic or heteroaromatic ring system having 5 to 24 aromatic ring atoms, which may in each case be substituted by one or more radicals $R^2$, or an aryloxy or heteroaryloxy group having 5 to 24 aromatic ring atoms, which may be substituted by one or more radicals $R^2$, or an aralkyl or heteroaralkyl group having 5 to 24 aromatic ring atoms, which may be substituted by one or more radicals $R^2$; two radicals $R^3$ which are bonded to the same carbon atom may form an aliphatic or aromatic ring system with one another here and thus form a spiro system; furthermore, $R^3$ may form an aliphatic ring system with an adjacent radical R or $R^1$;
with the proviso that two identical heteroatoms in the above-mentioned groups are not bonded directly to one another and two groups $C=O$ are not bonded directly to one another.

A BRIEF DESCRIPTION OF THE FIGURE

FIG. 1 illustrates the layer sequence of the OLED test components according to the examples.

In the structures of the formulae (1) and (2) depicted above and the further embodiments of these structures mentioned as preferred, a double bond is formally depicted on the carbon atoms to which the radicals Y are bonded. This represents a simplification of the chemical structure, since these two carbon atoms are bonded into an aromatic or heteroaromatic system, and the bond between these two carbon atoms is thus formally between the degree of bonding of a single bond and that of a double bond. The drawing-in of the formal double bond should thus not be interpreted as limiting for the structure, but instead it is apparent to the person skilled in the art that this means an aromatic bond.

The absence of acidic benzylic protons is achieved in the formulae (3) to (5) by $A^1$ and $A^3$, if they stand for $C(R^3)_2$, being defined in such a way that $R^3$ is not equal to hydrogen. The absence of acidic benzylic protons is achieved in the formulae (6) to (9) by them being a bicyclic structure. Owing to the rigid spatial arrangement, $R^1$, if it stands for H, is significantly less acidic than benzylic protons, since the corresponding anion of the bicyclic structure is not mesomerism-stabilised. Even if $R^1$ in formulae (6) to (9) stands for H, this is a non-acidic proton in the sense of the present application. "Adjacent carbon atoms" here means that the carbon atoms are bonded directly to one another. Furthermore, "adjacent radicals" in the definition of the radicals means that these radicals are bonded to the same carbon atom or to adjacent carbon atoms. These definitions apply correspondingly, inter alia, to the terms "adjacent groups" and "adjacent substituents".

An aryl group in the sense of this invention contains 6 to 40 C atoms; a heteroaryl group in the sense of this invention contains 2 to 40 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc.

An aromatic ring system in the sense of this invention contains 6 to 60 C atoms in the ring system. A heteroaromatic ring system in the sense of this invention contains 1 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, a C, N or O atom or a carbonyl group. Thus, for example, systems such as 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are interrupted, for example, by a linear or cyclic alkyl group or by a silyl group.

Furthermore, systems in which two or more aryl or heteroaryl groups are bonded directly to one another, such as, for example, biphenyl or terphenyl, are likewise intended to be taken to be an aromatic or heteroaromatic ring system.

A cyclic alkyl, alkoxy or thioalkoxy group in the sense of this invention is taken to mean a monocyclic, bicyclic or polycyclic group.

For the purposes of the present invention, a $C_1$- to $C_{40}$-alkyl group, in which, in addition, individual H atoms or $CH_2$ groups may be substituted by the above-mentioned groups, is taken to mean, for example, the radicals methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo-[2.2.2]octyl, 2-bicyclo[2.2.2]octyl, 2-(2,6-dimethyl)octyl, 3-(3,7-dimethyl)-octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)-cyclohex-1-yl. An alkenyl group is taken to mean, for example, ethenyl, propenyl, butenyl, pentenyl, cyclopentenyl, hexenyl, cyclohexenyl, heptenyl, cycloheptenyl, octenyl, cyclooctenyl and cyclooctadienyl. An alkynyl group is taken to mean, for example, ethynyl, propynyl, butynyl, pentynyl, hexynyl, heptynyl and octynyl. A $C_1$- to $C_{40}$-alkoxy group is taken to mean, for example, methoxy, trifluoromethoxy, ethoxy, n-propoxy, i-propoxy, n-butoxy, i-butoxy, s-butoxy, t-butoxy and 2-methylbutoxy.

An aromatic or heteroaromatic ring system having 5 to 60 aromatic ring atoms, which may also in each case be substituted by the radicals mentioned above and which may be linked to the aromatic or heteroaromatic ring system via any desired positions, is taken to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Furthermore, preference is given to compounds of the formula (1) or (2) in which at most two, preferably at most one, of the groups $A^1$, $A^2$ and $A^3$ in their ring structures of one of the formulae (3), (4), (5), (6), (7), (8) and (9) stand for O, S or $NR^3$, particularly preferably none of the groups $A^1$, $A^2$ and $A^3$ stands for O, S or $NR^3$.

In addition, preference is given to compounds which are distinguished by the fact that, in the ring structures of one of the formulae (3), (4), (5), (6), (7), (8) and (9), at least one of the groups $A^1$ and $A^3$ stands, identically or differently, for O or $NR^3$ and $A^2$ stands for $C(R^1)_2$.

According to a further embodiment of the present invention, preference is given to compounds which are characterised in that, in the ring structures of one of the formulae (3), (4), (5), (6), (7), (8) and (9), the groups $A^1$ and $A^3$ stand, identically or differently on each occurrence, for $C(R^3)_2$ and $A^2$ stands for $C(R^1)_2$, preferably for $C(R^3)_2$ and particularly preferably for $CH_2$.

Preference is furthermore given to compounds in which the radicals $R^1$ which are bonded to the bridgehead in the ring structures of the formulae (6), (7), (8) and (9) stand for H, D, F or $CH_3$.

It may furthermore be provided that two adjacent radicals Y in the structure of the formula (1) or formula (2) form a ring structure of one of the following formulae (3-A) to (3-F):

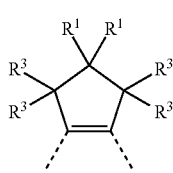

formula (3-A)

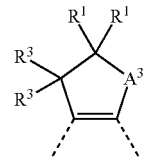

formula (3-B)

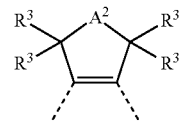

formula (3-C)

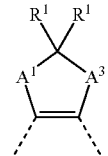

formula (3-D)

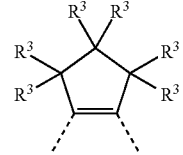

formula (3-E)

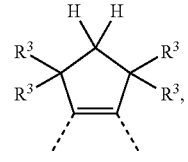

formula (3-F)

where $A^1$, $A^2$ and $A^3$ stand, identically or differently on each occurrence, for O or $NR^3$, the dashed lines represent the bonds from the two carbon atoms of group Y to the radicals X of the aromatic or heteroaromatic ring in the structure of the formula (1) or formula (2), and $R^1$ and $R^3$ have the meaning given above. Of the said compounds having structures of the formulae (3-A), (3-B), (3-C), (3-D), (3-E) or (3-F), preference is given to compounds having structures of the formulae (3-A), (3-B), (3-C), (3-E) and/or (3-F) and particular preference is given to those having structures of the formulae (3-C), (3-E) and/or (3-F).

According to a particular aspect of the present invention, it may be provided that two adjacent radicals Y in the structure of the formula (1) or formula (2) form a ring structure of one of the following formulae (4-A) to (4-F):

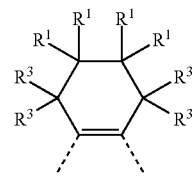

formula (4-A)

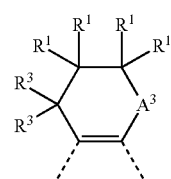

formula (4-B)

formula (4-C)

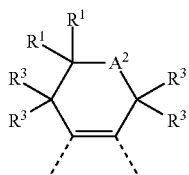

formula (4-D)

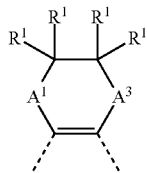

formula (4-E)

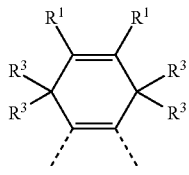

formula (4-F)

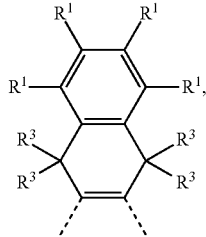

where $A^1$, $A^2$ and $A^3$ stand, identically or differently on each occurrence, for O or $NR^3$, the dashed lines represent the bonds from the two carbon atoms of group Y to the radicals X of the aromatic or heteroaromatic ring in the structure of the formula (1) or formula (2), and $R^1$ and $R^3$ have the meaning given above.

Of the said compounds having structures of the formulae (4-A) to (4-F), preference is given to compounds having structures of the formulae (4-A), (4-B), (4-C), (4-E) and/or (4-F) and particular preference is given to those having structures of the formulae (4-A) and/or (4-E).

Two adjacent radicals Y in the structure of the formula (1) or formula (2) may preferably form a ring structure of one of the following formulae (5-A) to (5-E):

formula (5-A)

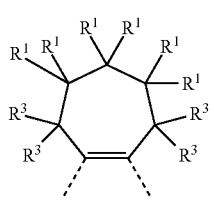

formula (5-B)

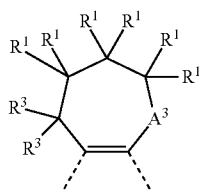

formula (5-C)

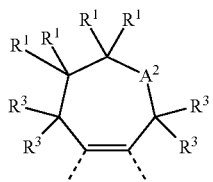

formula (5-D)

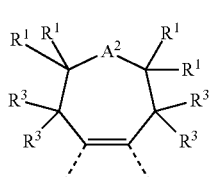

formula (5-E)

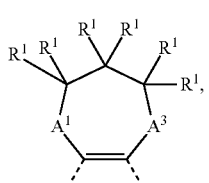

where $A^1$, $A^2$ and $A^3$ stand, identically or differently on each occurrence, for O or $NR^3$, the dashed lines represent the bonds from the two carbon atoms of group Y to the radicals X of the aromatic or heteroaromatic ring in the structure of the formula (1) or formula (2), and $R^1$ and $R^3$ have the meaning given above.

It may furthermore be provided that two adjacent radicals Y in the structure of the formula (1) or formula (2) form a ring structure of one of the following formulae (6-A) to (6-C):

formula (6-A)

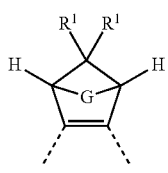

formula (6-B)

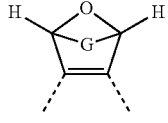

formula (6-C)

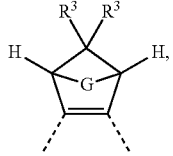

where the symbols used have the meanings given above, and the dashed lines represent the bonds from the two carbon atoms of group Y to the radicals X of the aromatic or heteroaromatic ring in the structure of the formula (1) or formula (2). Of the said compounds having ring structures of the formulae (6-A) to (6-C), preference is given to compounds which have structures of the formula (6-B) or (6-C), where compounds having structures of the formula (6-C) are particularly preferred.

Preference is furthermore given to compounds in which two adjacent radicals Y in the structure of the formula (1) or formula (2) form a ring structure of one of the following formulae (7-A), (8-A) or (9-A):

formula (7-A)

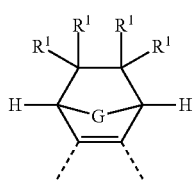

formula (8-A)

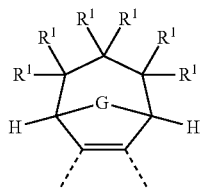

formula (9-A)

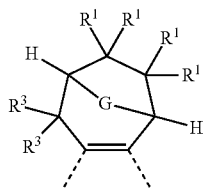

where the symbols used have the meanings given above, and the dashed lines represent the bonds from the two carbon atoms of group Y to the radicals X of the aromatic or heteroaromatic ring in the structure of the formula (1) or formula (2).

It may furthermore be provided that the group G in the structure of the formulae (6), (6-A), (6-B), (6-C), (7), (7-A), (8), (8-A), (9) and (9-A) stands for a 1,2-ethylene group, which may be substituted by one or more radicals $R^2$, where $R^2$ preferably stands, identically or differently on each occurrence, for H or an alkyl group having 1 to 4 C atoms, or an ortho-arylene group having 6 to 10 C atoms in the ring, which may be substituted by one or more radicals $R^2$, but is preferably unsubstituted, in particular an ortho-phenylene group, which may be substituted by one or more radicals $R^2$, but is preferably unsubstituted.

It may furthermore be provided that the radical $R^3$ in the structure of the formulae (3) to (9) stands, identically or differently on each occurrence, for F, a straight-chain alkyl group having 1 to 10 C atoms or a branched or cyclic alkyl group having 3 to 20 C atoms, where in each case one or more non-adjacent $CH_2$ groups may be replaced by $R^2C=CR^2$ and one or more H atoms may be replaced by D or F, or an aromatic or heteroaromatic ring system having 5 to 14 aromatic ring atoms, which may in each case be substituted by one or more radicals $R^2$; two radicals $R^3$ which are bonded to the same carbon atom may form an aliphatic or aromatic ring system with one another here and thus form a spiro system; furthermore, $R^3$ may form an aliphatic ring system with an adjacent radical R or $R^1$.

In compounds having structures of the formulae (3) to (9) and in the preferred embodiments of these formulae, the radical $R^3$ may preferably stand, identically or differently on each occurrence, for F, a straight-chain alkyl group having 1 to 3 C atoms, in particular methyl, or an aromatic or heteroaromatic ring system having 5 to 12 aromatic ring atoms, which may in each case be substituted by one or more radicals $R^2$, but is preferably unsubstituted; two radicals $R^3$ which are bonded to the same carbon atom may form an aliphatic or aromatic ring system with one another here and thus form a spiro system; furthermore, $R^3$ may form an aliphatic ring system with an adjacent radical R or $R^1$.

Examples of particularly preferred groups of the formula (3) are the groups (3-1) to (3-69) shown below:

(3-1)

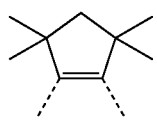

(3-2)

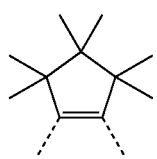

(3-3)

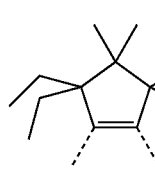

(3-4)

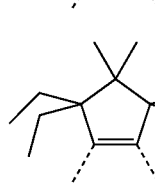

(3-5)

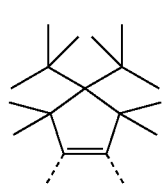

(3-6)

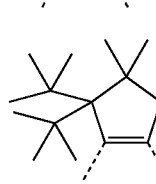

(3-7)

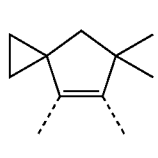

(3-8)

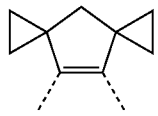

(3-9)

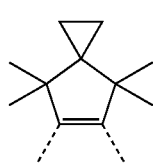

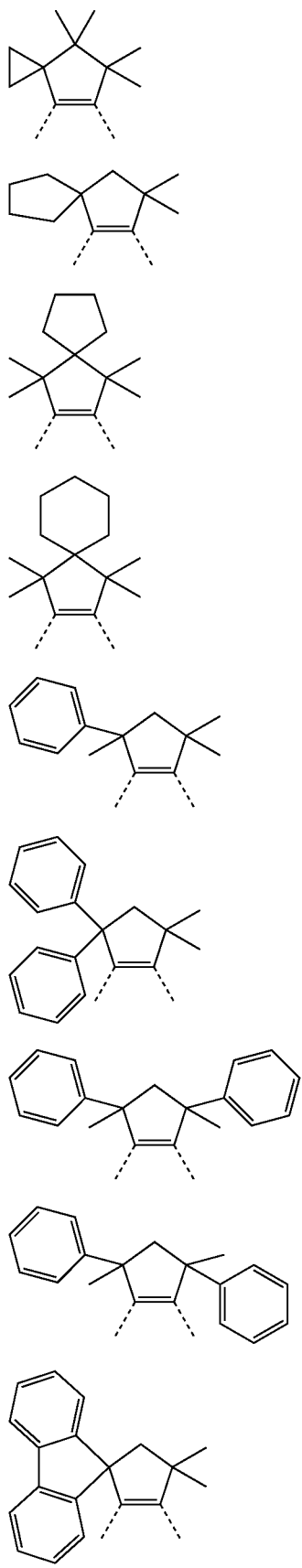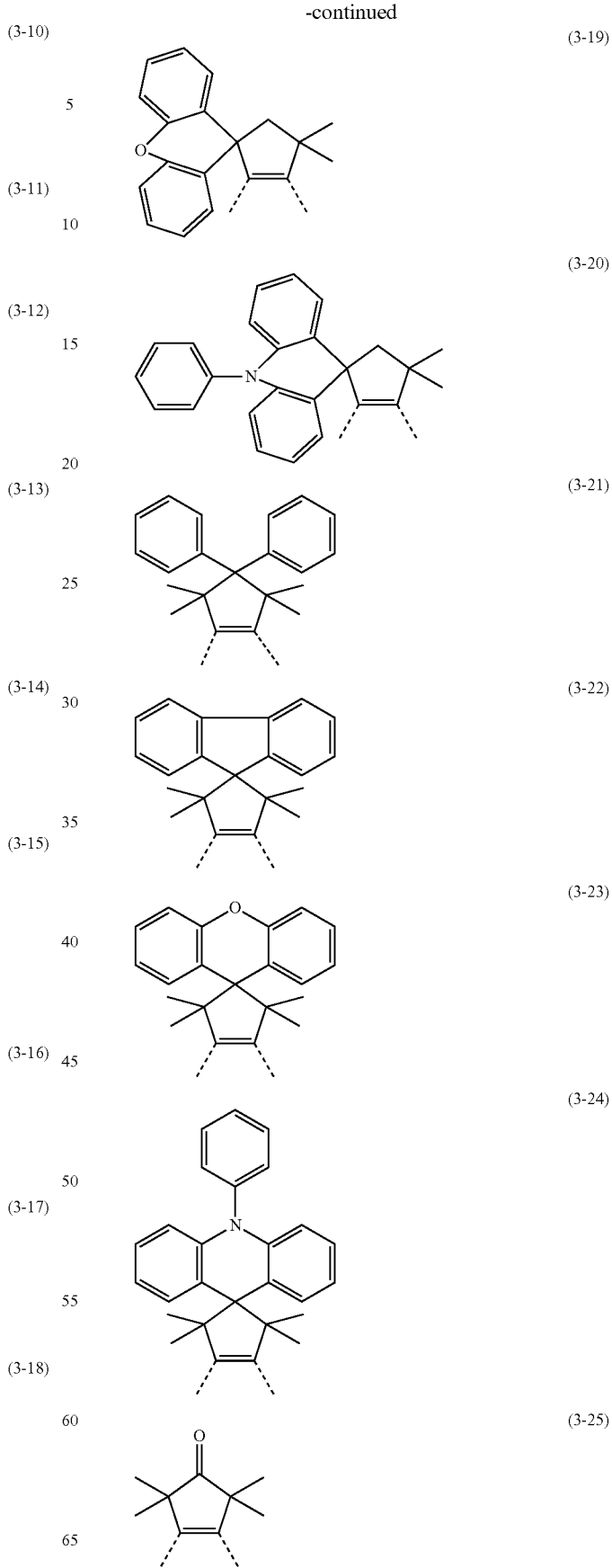

(3-26) 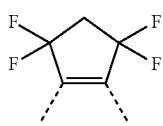
(3-27) 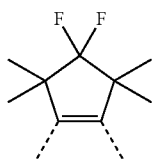
(3-28) 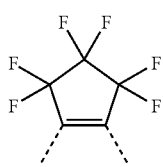
(3-29) 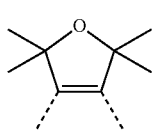
(3-30) 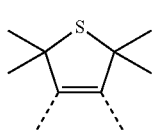
(3-31) 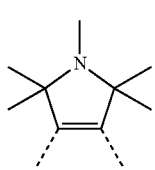
(3-32) 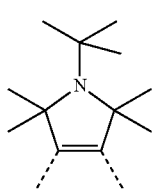
(3-33) 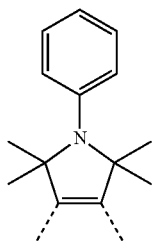
(3-34) 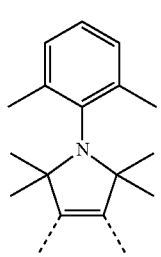
(3-35) 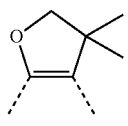
(3-36) 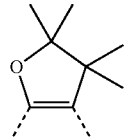
(3-37) 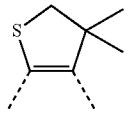
(3-38) 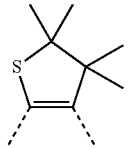
(3-39) 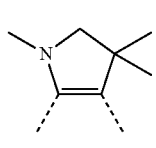
(3-40) 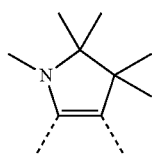
(3-41) 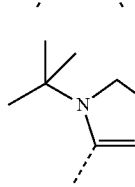
(3-42) 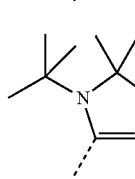
(3-43) 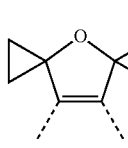
(3-44) 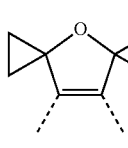
(3-45) 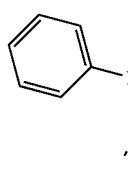

-continued
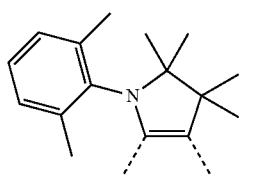 (3-46)
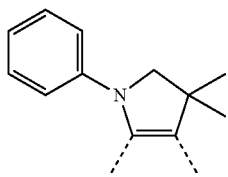 (3-47)
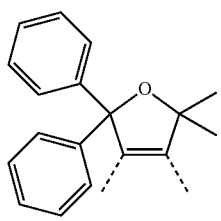 (3-48)
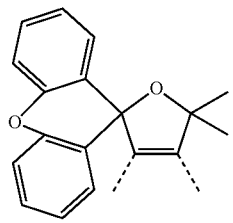 (3-49)
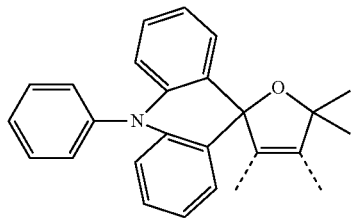 (3-50)
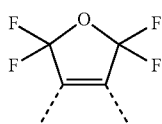 (3-51)
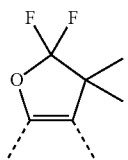 (3-52)
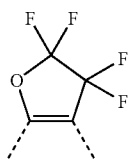 (3-53)
-continued
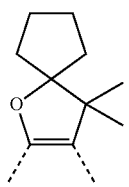 (3-54)
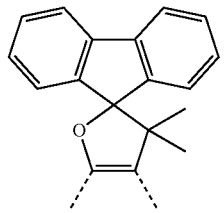 (3-55)
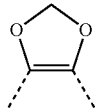 (3-56)
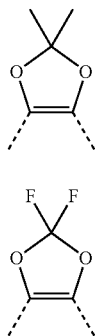 (3-57)
(3-58)
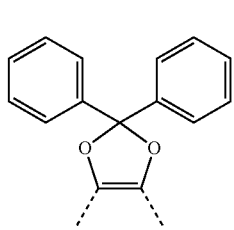 (3-59)
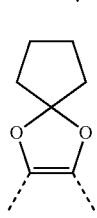 (3-60)
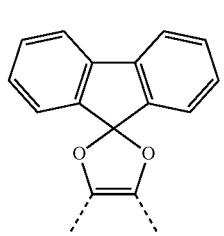 (3-61)

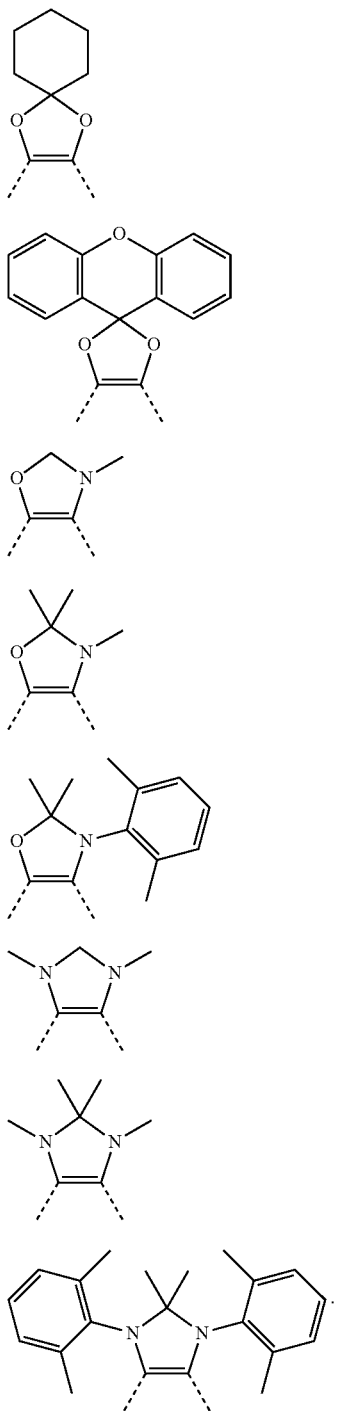
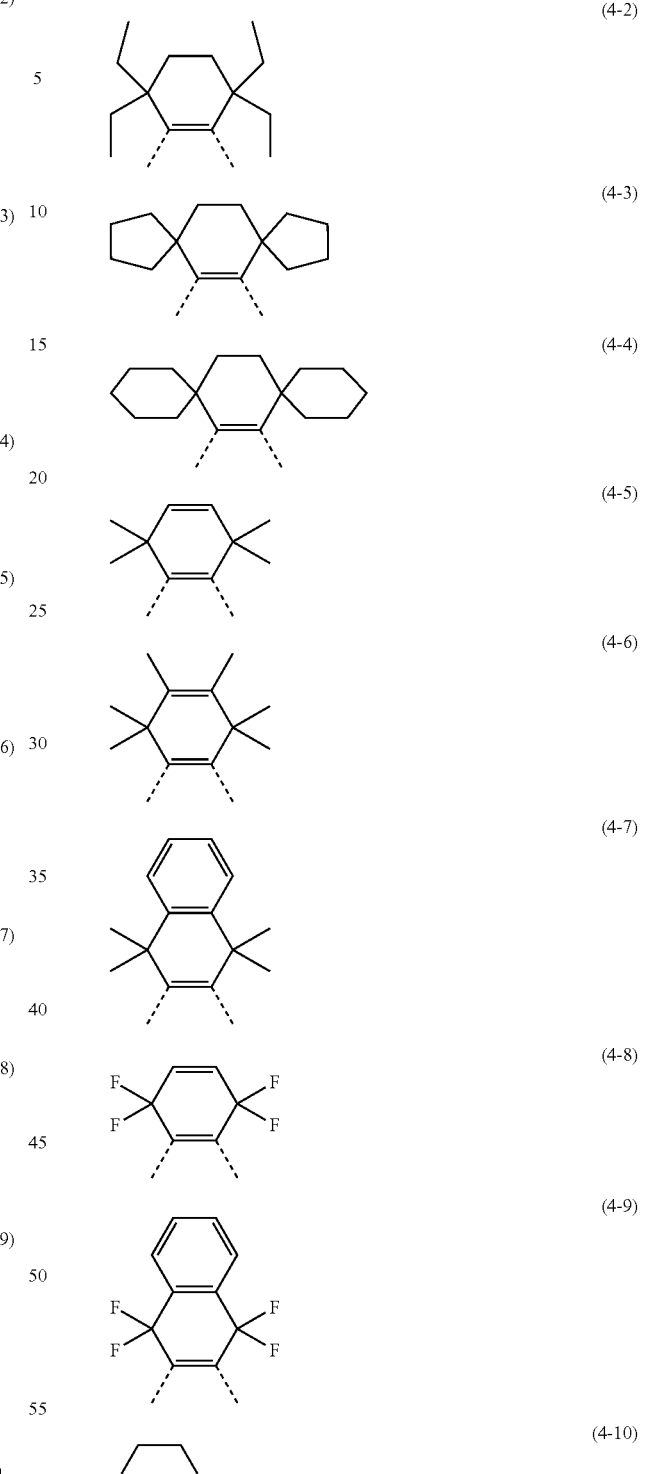
Examples of particularly preferred groups of the formula (4) are the groups (4-1) to (4-14) shown below:
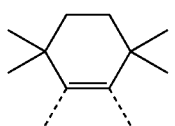

(4-12)
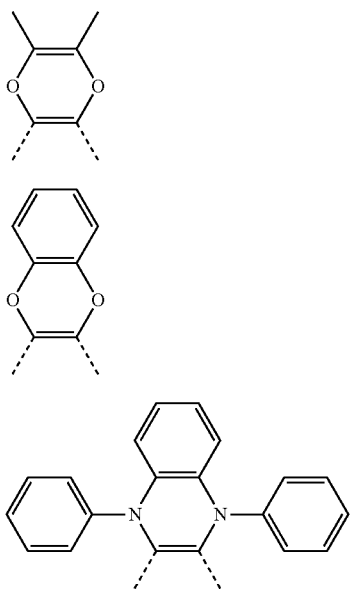
(4-13)
(4-14)
Examples of particularly preferred groups of the formulae (5), (8) and (9) are the groups (5-1), (8-1) and (9-1) shown below:
(5-1)
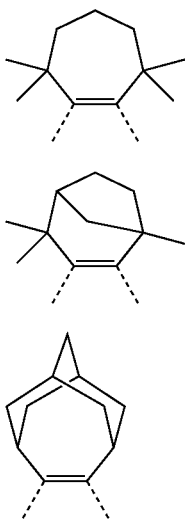
(8-1)
(9-1)
Examples of particularly preferred groups of the formula (6) are the groups (6-1) to (6-22) shown below:
(6-1)
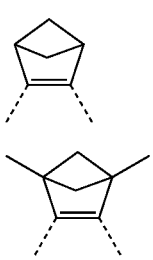
(6-2)
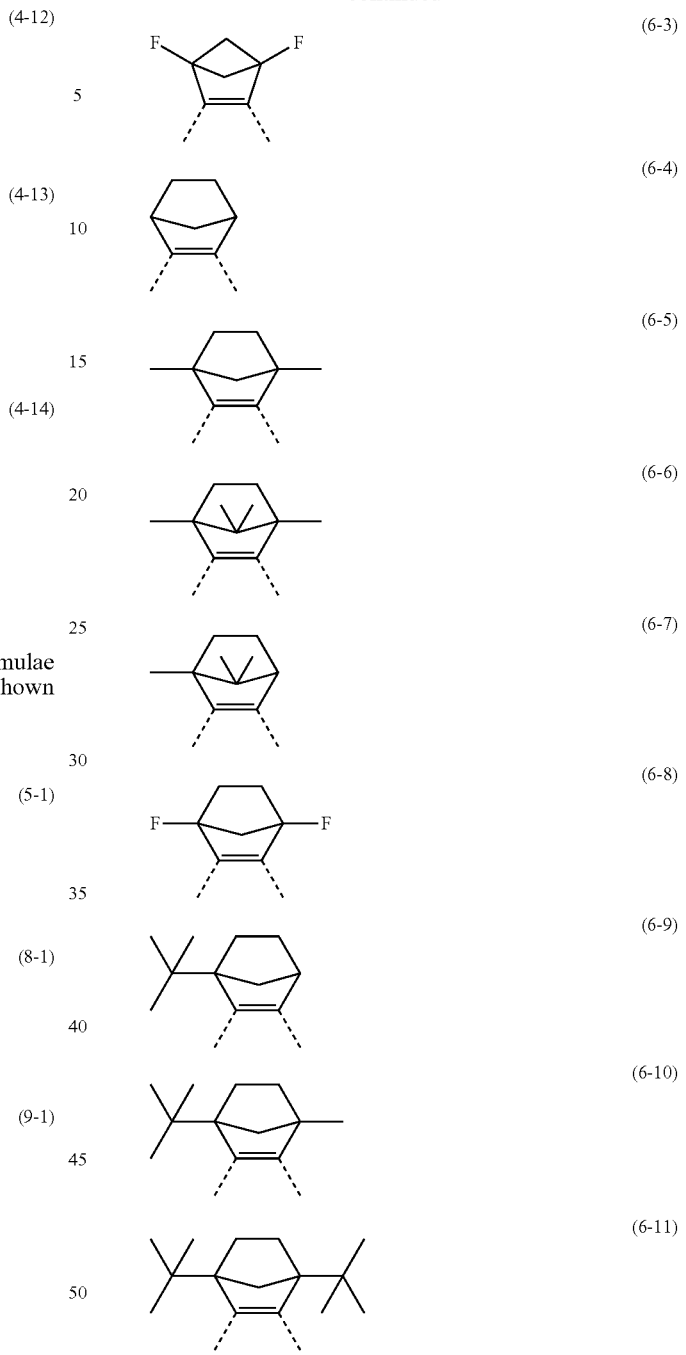
(6-3)
(6-4)
(6-5)
(6-6)
(6-7)
(6-8)
(6-9)
(6-10)
(6-11)
(6-12)
(6-13)

(6-14) 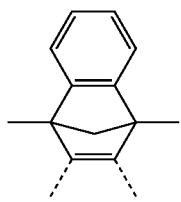

(6-15) 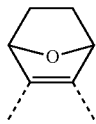

(6-16) 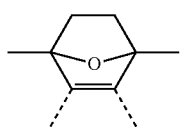

(6-17) 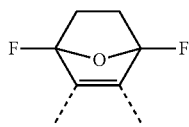

(6-18) 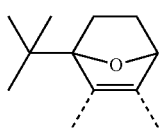

(6-19) 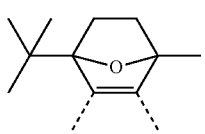

(6-20) 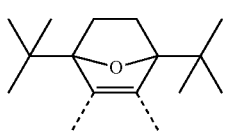

(6-21) 

(6-22) 

Examples of particularly preferred groups of the formula (7) are the groups (7-1) to (7-5) shown below:

(7-1) 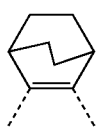

(7-2) 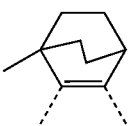

(7-3) 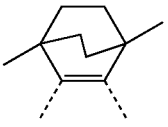

(7-4) 

(7-5) 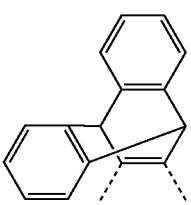

Preferably, two symbols X in formula (1) or (2) stand for N, particularly preferably a maximum of one symbol X in formula (1) or (2) stands for N. Particularly preferably, all symbols X in structures of the formula (1) or (2) stand for CR.

In general, compounds of the formula (1) are preferred over the compounds of the formula (2), so that particularly preferred compounds have a ring structure of the formulae (3) to (9) shown above. Compounds of the formula (1) having ring structures of the formula (3) or (4) are particularly preferred here.

It may furthermore be provided that the aromatic compound having a structure of the formula (1) or (2) has a molecular weight of preferably ≤2000 g/mol, particularly preferably ≤1000 g/mol and especially preferably ≤600 g/mol.

The aromatic compound having a structure of the formula (1) or (2) can preferably be selected from compounds of the formulae (10), (11) and (12), formula (10)

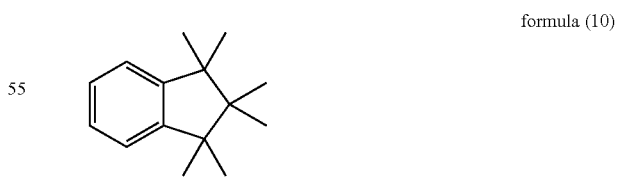

formula (11)

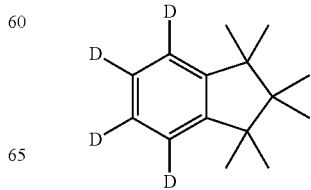

formula (12)

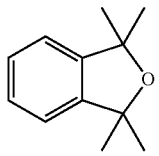

where particular preference is given to the compound of the formula (10).

Compounds of the formula (1) or (2) can serve as additives for multiple purposes, for example in order to adjust the properties of formulations, such as, for example, the surface tension and/or the rheological properties, such as, for example, the viscosity.

Compounds of the formula (1) or (2) can particularly preferably be employed as solvents. This enables the organofunctional materials described above and below which can be employed for the production of functional layers of electronic devices to be applied to substrates or functional layers with surprisingly high quality using known coating methods which are described in greater detail in this application.

According to a particular aspect of the present invention, the proportion of the aromatic compound having a structure of the formula (1) or (2) in the formulation can be at least 0.1% by weight, preferably at least 1% by weight, particularly preferably at least 5% by weight and especially preferably at least 10% by weight, or preferably at least 20% by weight, particularly preferably at least 40% by weight and especially preferably at least 80% by weight, where the aromatic compound having a structure of the formula (1) or (2) is preferably employed as solvent from a proportion of at least 20% by weight.

The aromatic compound having a structure of the formula (1) or (2) can preferably have a surface tension of at most 40 mN/m, preferably at most 35 mN/m and particularly preferably at most 30 mN/m, where the aromatic compound having a structure of the formula (1) or (2) is preferably employed as solvent.

A further preferred embodiment of the present invention is characterised in that the aromatic compound having a structure of the formula (1) or (2) preferably has a boiling point of at most 300° C., particularly preferably at most 280° C., where the aromatic compound having a structure of the formula (1) or (2) is preferably employed as solvent.

It may furthermore be provided that the aromatic compound having a structure of the formula (1) or (2) preferably has a viscosity of at least 3 mPas, particularly preferably at least 5 mPas, where the aromatic compound having a structure of the formula (1) or (2) is preferably employed as solvent.

The formulation according to the invention comprises at least one organic functional material which can be employed for the production of functional layers of electronic devices. Functional materials are generally the organic or inorganic materials which are introduced between the anode and the cathode of an electronic device.

The term organic functional material denotes, inter alia, organic conductors, organic semiconductors, organic fluorescent compounds, organic phosphorescent compounds, organic light-absorbent compounds, organic light-sensitive compounds, organic photosensitisation agents and other organic photoactive compounds. The term organic functional material furthermore encompasses organometallic complexes of transition metals, rare earths, lanthanides and actinides.

The organofunctional material is preferably selected from the group consisting of fluorescent emitters, phosphorescent emitters, host materials, matrix materials, exciton-blocking materials, electron-transport materials, electron-injection materials, hole-conductor materials, hole-injection materials, n-dopants, p-dopants, wide-band-gap materials, electron-blocking materials and hole-blocking materials.

Preferred embodiments of organofunctional materials are disclosed in detail in WO 2011/076314 A1, where this document is incorporated into the present application by way of reference.

The organofunctional material can be a compound having a low molecular weight, a polymer, an oligomer or a dendrimer, where the organofunctional material may also be in the form of a mixture. Thus, the formulations according to the invention may comprise two different compounds having a low molecular weight, one compound having a low molecular weight and one polymer or two polymers (blend).

Organofunctional materials are frequently described via the properties of the frontier orbitals, which are described in greater detail below. Molecular orbitals, in particular also the highest occupied molecular orbital (HOMO) and the lowest unoccupied molecular orbital (LUMO), their energy levels and the energy of the lowest triplet state $T_1$ or of the lowest excited singlet state $S_1$ of the materials are determined via quantum-chemical calculations. In order to calculate organic substances without metals, firstly a geometry optimisation is carried out using the "Ground State/Semi-empirical/Default Spin/AM1/Charge 0/Spin Singlet" method. An energy calculation is subsequently carried out on the basis of the optimised geometry. The "TD-SCF/DFT/Default Spin/B3PW91" method with the "6-31G(d)" base set (charge 0, spin singlet) is used here. For metal-containing compounds, the geometry is optimised via the "Ground State/Hartree-Fock/Default Spin/LanL2 MB/Charge 0/Spin Singlet" method. The energy calculation is carried out analogously to the above-described method for the organic substances, with the difference that the "LanL2DZ" base set is used for the metal atom and the "6-31G(d)" base set is used for the ligands. The energy calculation gives the HOMO energy level HEh or LUMO energy level LEh in hartree units. The HOMO and LUMO energy levels in electron volts calibrated with reference to cyclic voltammetry measurements are determined therefrom as follows:

HOMO(eV)=((*HEh*\*27.212)−0.9899)/1.1206

LUMO(eV)=((*LEh*\*27.212)−2.0041)/1.385

For the purposes of this application, these values are to be regarded as HOMO and LUMO energy levels respectively of the materials.

The lowest triplet state $T_1$ is defined as the energy of the triplet state having the lowest energy which arises from the quantum-chemical calculation described.

The lowest excited singlet state $S_1$ is defined as the energy of the excited singlet state having the lowest energy which arises from the quantum-chemical calculation described.

The method described herein is independent of the software package used and always gives the same results. Examples of frequently used programs for this purpose are "Gaussian09W" (Gaussian Inc.) and Q-Chem 4.1 (Q-Chem, Inc.).

Compounds having hole-injection properties, also called hole-injection materials herein, simplify or facilitate the transfer of holes, i.e. positive charges, from the anode into an organic layer. In general, a hole-injection material has an HOMO level which is in the region of or above the level of the anode, i.e. in general is at least −5.3 eV.

Compounds having hole-transport properties, also called hole-transport materials herein, are capable of transporting holes, i.e. positive charges, which are generally injected from the anode or an adjacent layer, for example a hole-injection layer. A hole-transport material generally has a high HOMO level of preferably at least −5.4 eV. Depending on the structure of an electronic device, it may also be possible to employ a hole-transport material as hole-injection material.

The preferred compounds which have hole-injection and/or hole-transport properties include, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital).

As compounds which have hole-injection and/or hole-transport properties, particular mention may be made of phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP-A-56-46234), polycyclic aromatic compounds (EP 1009041), polyarylalkane derivatives (U.S. Pat. No. 3,615,402), fluorenone derivatives (JP-A-54-110837), hydrazone derivatives (U.S. Pat. No. 3,717,462), acylhydrazones, stilbene derivatives (JP-A-61-210363), silazane derivatives (U.S. Pat. No. 4,950,950), polysilanes (JP-A-2-204996), aniline copolymers (JP-A-2-282263), thiophene oligomers (JP Heisei 1 (1989) 211399), polythiophenes, poly(N-vinylcarbazole) (PVK), polypyrroles, polyanilines and other electrically conducting macromolecules, porphyrin compounds (JP-A-63-2956965, U.S. Pat. No. 4,720,432), aromatic dimethylidene-type compounds, carbazole compounds, such as, for example, CDBP, CBP, mCP, aromatic tertiary amine and styrylamine compounds (U.S. Pat. No. 4,127,412), such as, for example, triphenylamines of the benzidine type, triphenylamines of the styrylamine type and triphenylamines of the diamine type. It is also possible to use arylamine dendrimers (JP Heisei 8 (1996) 193191), monomeric triarylamines (U.S. Pat. No. 3,180,730), triarylamines containing one or more vinyl radicals and/or at least one functional group containing active hydrogen (U.S. Pat. Nos. 3,567,450 and 3,658,520), or tetraaryldiamines (the two tertiary amine units are connected via an aryl group). More triarylamino groups may also be present in the molecule. Phthalocyanine derivatives, naphthalocyanine derivatives, butadiene derivatives and quinoline derivatives, such as, for example, dipyrazino[2,3-f:2',3'-h]-quinoxalinehexacarbonitrile, are also suitable.

Preference is given to aromatic tertiary amines containing at least two tertiary amine units (US 2008/0102311 A1, U.S. Pat. Nos. 4,720,432 and 5,061,569), such as, for example, NPD (α-NPD=4,4'-bis[N-(1-naphthyl)-N-phenylamino]biphenyl) (U.S. Pat. No. 5,061,569), TPD 232 (=N,N'-bis-(N,N'-diphenyl-4-aminophenyl)-N,N-diphenyl-4,4'-diamino-1,1'-biphenyl) or MTDATA (MTDATA or m-MTDATA=4,4',4"-tris[3-methylphenyl)phenylamino]-triphenylamine) (JP-A-4-308688), TBDB (=N,N,N',N'-tetra(4-biphenyl)-diaminobiphenylene), TAPC (=1,1-bis(4-di-p-tolylaminophenyl)cyclo-hexane), TAPPP (=1,1-bis(4-di-p-tolylaminophenyl)-3-phenylpropane), BDTAPVB (=1,4-bis[2-[4-[N,N-di(p-tolyl)amino]phenyl]vinyl]benzene), TTB (=N,N,N',N'-tetra-p-tolyl-4,4'-diaminobiphenyl), TPD (=4,4'-bis[N-3-methylphenyl]-N-phenylamino)biphenyl), N,N,N',N'-tetraphenyl-4,4'''-diamino-1,1',4',1'',4'',1'''-quaterphenyl, likewise tertiary amines containing carbazole units, such as, for example, TCTA (=4-(9H-carbazol-9-yl)-N,N-bis[4-(9H-carbazol-9-yl)phenyl]benzenamine). Preference is likewise given to hexa-azatriphenylene compounds in accordance with US 2007/0092755 A1 and phthalocyanine derivatives (for example H$_2$Pc, CuPc (=copper phthalocyanine), CoPc, NiPc, ZnPc, PdPc, FePc, MnPc, ClAlPc, ClGaPc, ClInPc, ClSnPc, Cl$_2$SiPc, (HO)AlPc, (HO)GaPc, VOPc, TiOPc, MoOPc, GaPc-O-GaPc).

Particular preference is given to the following triarylamine compounds of the formulae (TA-1) to (TA-12), which are disclosed in the documents EP 1162193 B1, EP 650 955 B1, Synth. Metals 1997, 91(1-3), 209, DE 19646119 A1, WO 2006/122630 A1, EP 1 860 097 A1, EP 1834945 A1, JP 08053397 A, U.S. Pat. No. 6,251,531 B1, US 2005/0221124, JP 08292586 A, U.S. Pat. No. 7,399,537 B2, US 2006/0061265 A1, EP 1 661 888 and WO 2009/041635. The said compounds of the formulae (TA-1) to (TA-12) may also be substituted:

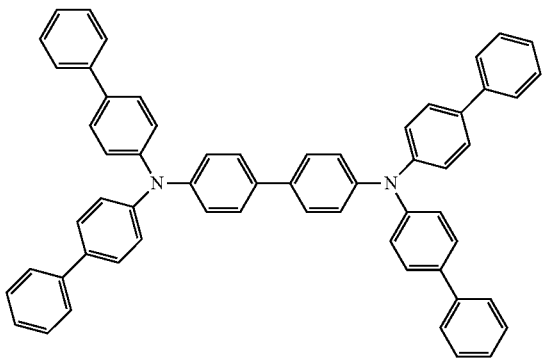

formula TA-1

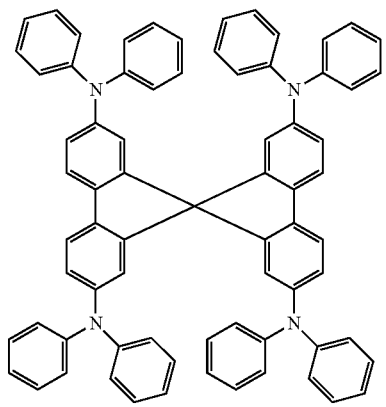

formula TA-2

-continued
formula TA-3
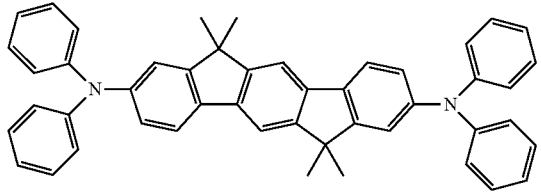
formula TA-4
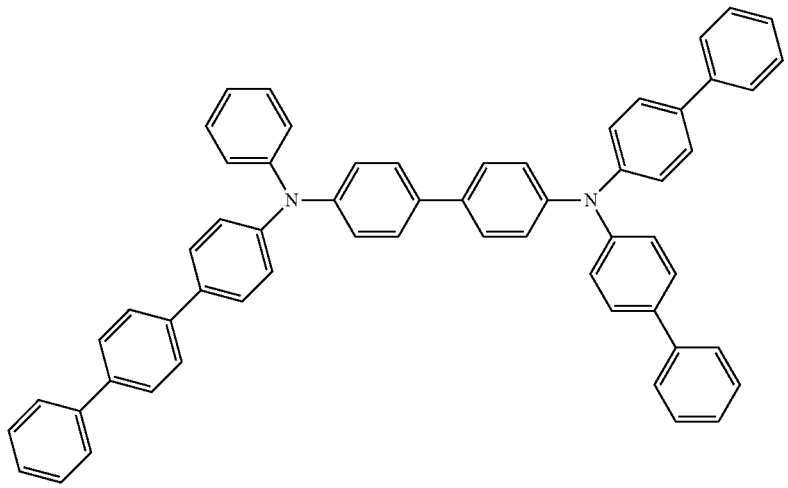
formula TA-5
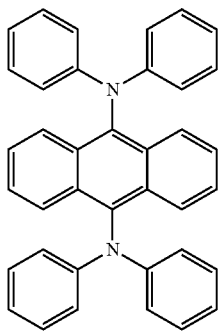
formula TA-6
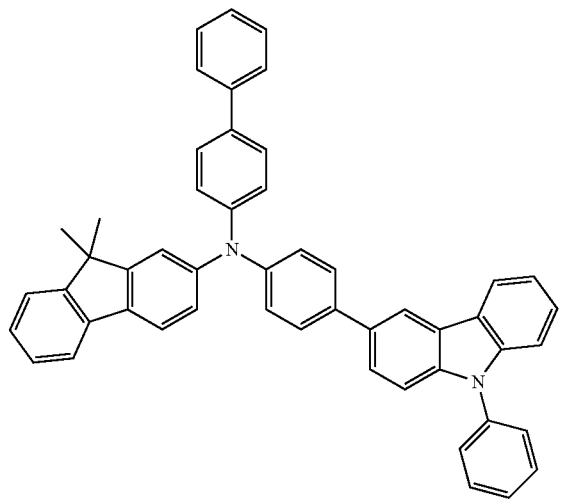
formula TA-7
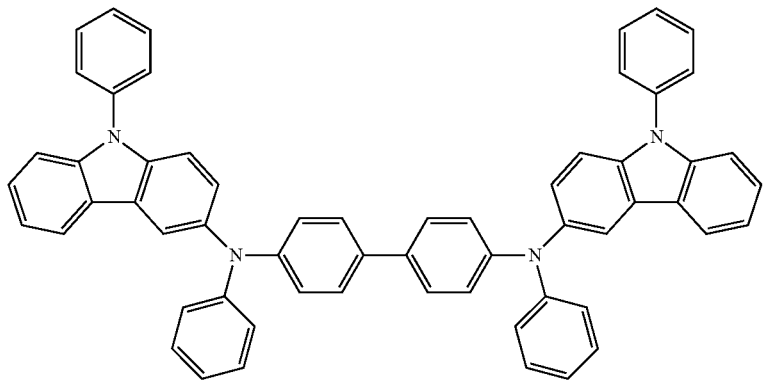

formula TA-8
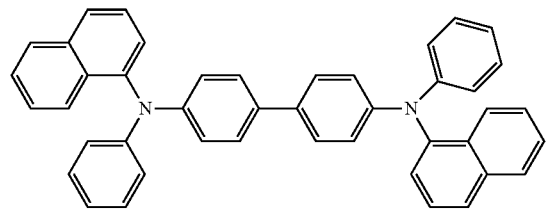
NPB = alpha-NPD
formula TA-9
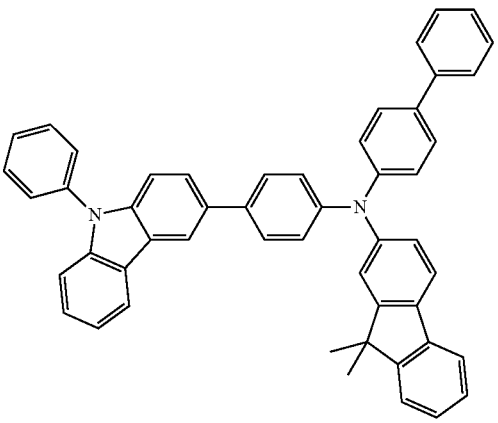
formula TA-10
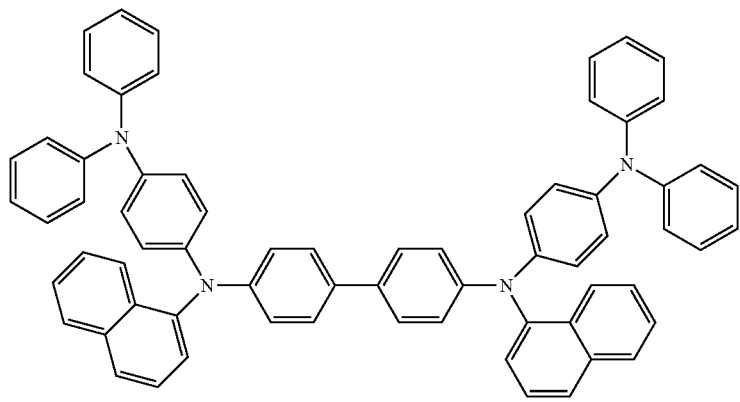
formula TA-11
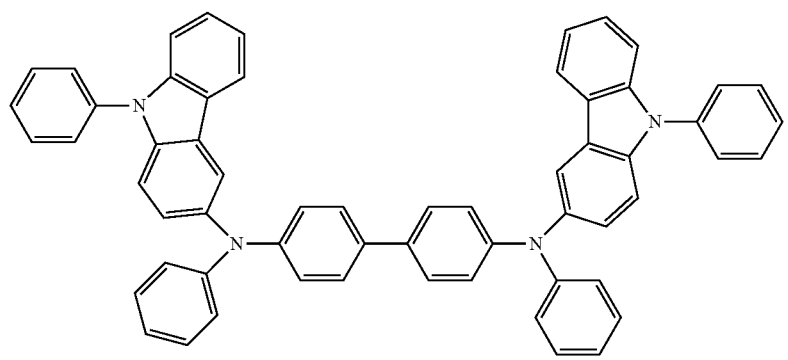

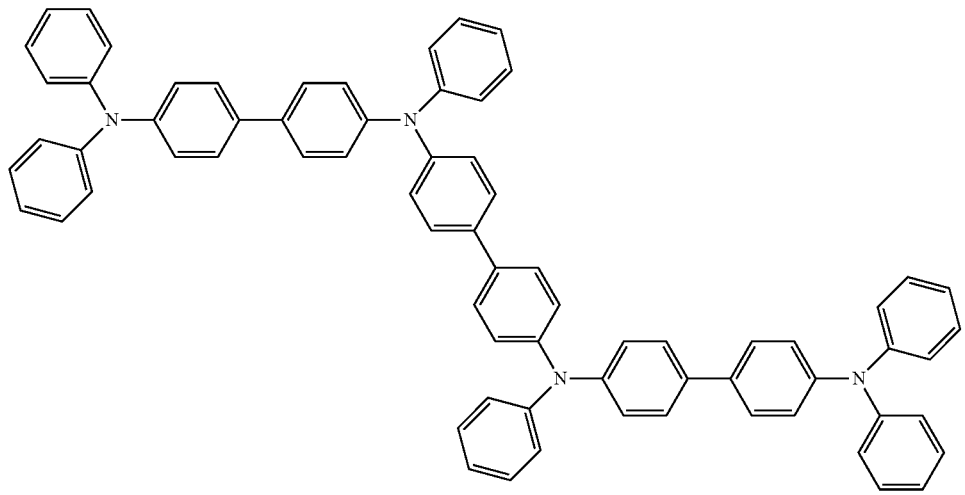

formula TA-12

Further compounds which can be employed as hole-injection materials are described in EP 0891121 A1 and EP 1029909 A1, injection layers in general in US 2004/0174116 A1.

These arylamines and heterocycles which are generally employed as hole-injection and/or hole-transport materials preferably result in an HOMO in the polymer of greater than −5.8 eV (vs. vacuum level), particularly preferably greater than −5.5 eV.

Compounds which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital).

Particularly suitable compounds for electron-transporting and electron-injecting layers are metal chelates of 8-hydroxyquinoline (for example LiQ, AlQ$_3$, GaQ$_3$, MgQ$_2$, ZnQ$_2$, InQ$_3$, ZrQ$_4$), BAlQ, Ga oxinoid complexes, 4-azaphenanthren-5-ol-Be complexes (U.S. Pat. No. 5,529,853 A, cf. formula ET-1), butadiene derivatives (U.S. Pat. No. 4,356,429), heterocyclic optical brighteners (U.S. Pat. No. 4,539,507), benzimidazole derivatives (US 2007/0273272 A1), such as, for example, TPBI (U.S. Pat. No. 5,766,779, cf. formula ET-2), 1,3,5-triazines, for example spirobifluorenyltriazine derivatives (for example in accordance with DE 102008064200), pyrenes, anthracenes, tetracenes, fluorenes, spirofluorenes, dendrimers, tetracenes (for example rubrene derivatives), 1,10-phenanthroline derivatives (JP 2003-115387, JP 2004-311184, JP-2001-267080, WO 02/043449), silacyclopentadiene derivatives (EP 1480280, EP 1478032, EP 1469533), borane derivatives, such as, for example, triarylborane derivatives containing Si (US 2007/0087219 A1, cf. formula ET-3), pyridine derivatives (JP 2004-200162), phenanthrolines, especially 1,10-phenanthroline derivatives, such as, for example, BCP and Bphen, also several phenanthrolines connected via biphenyl or other aromatic groups (US-2007-0252517 A1) or phenanthrolines connected to anthracene (US 2007-0122656 A1, cf. formulae ET-4 and ET-5).

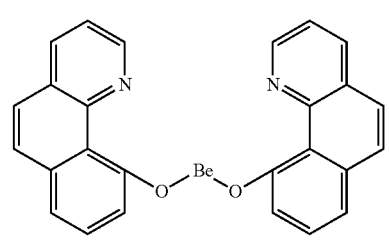

formula ET-1

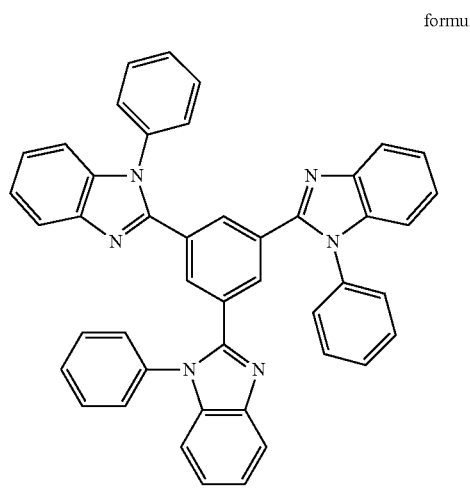

formula ET-2

TPBI
2,2′,2″-(1,3,5-benzenetriyl)tris(1-phenyl-1H-benzimidazole)

formula ET-3

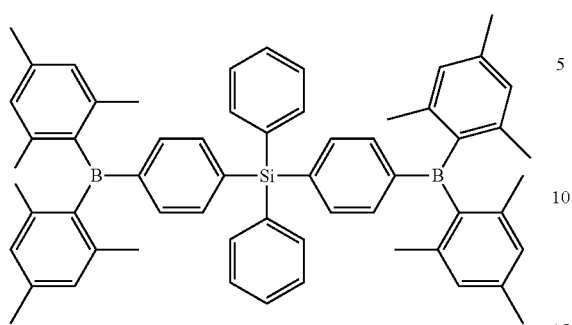

formula ET-5

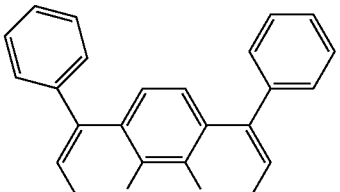

formula ET-4

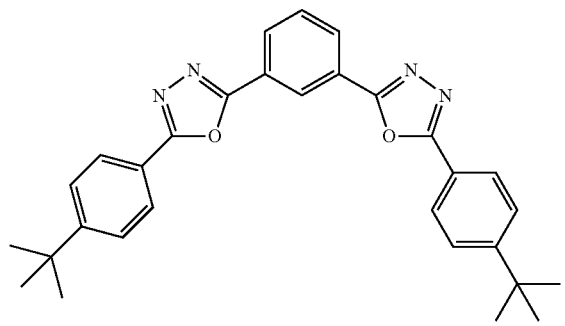

Likewise suitable are heterocyclic organic compounds, such as, for example, thiopyran dioxides, oxazoles, triazoles, imidazoles or oxadiazoles. Examples of the use of five-membered rings containing N, such as, for example, oxazoles, preferably 1,3,4-oxadiazoles, for example compounds of the formulae ET-6, ET-7, ET-8 and ET-9, which are disclose, inter alia, in US 2007/0273272 A1; thiazoles, oxadiazoles, thiadiazoles, triazoles, inter alia, see US 2008/0102311 A1 and Y. A. Levin, M. S. Skorobogatova, Khimiya Geterotsiklicheskikh Soedinenii 1967 (2), 339-341, preferably compounds of the formula ET-10, silacyclopentadiene derivatives. Preferred compounds are the following of the formulae (ET-6) to (ET-10):

formula ET-6

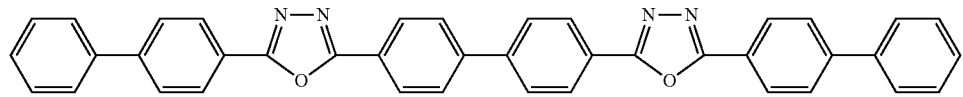

formula ET-7

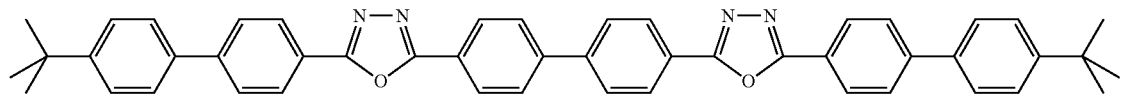

formula ET-8

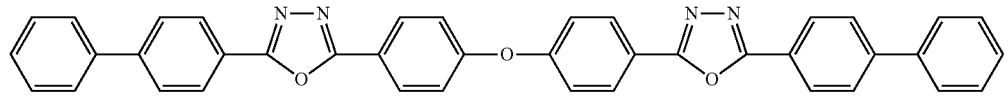

formula ET-9 formula ET-10

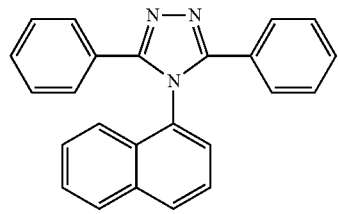

It is also possible to employ organic compounds, such as derivatives of fluorenone, fluorenylidenemethane, perylenetetracarbonic acid, anthraquinonedimethane, diphenoquinone, anthrone and anthraquinonediethylenediamine.

Preference is given to 2,9,10-substituted anthracenes (with 1- or 2-naphthyl and 4- or 3-biphenyl) or molecules which contain two anthracene units (US2008/0193796 A1, cf. formula ET-11). Also very advantageous is the connection of 9,10-substituted anthracene units to benzimidazole derivatives (US 2006 147747 A and EP 1551206 A1, cf. formulae ET-12 and ET-13).

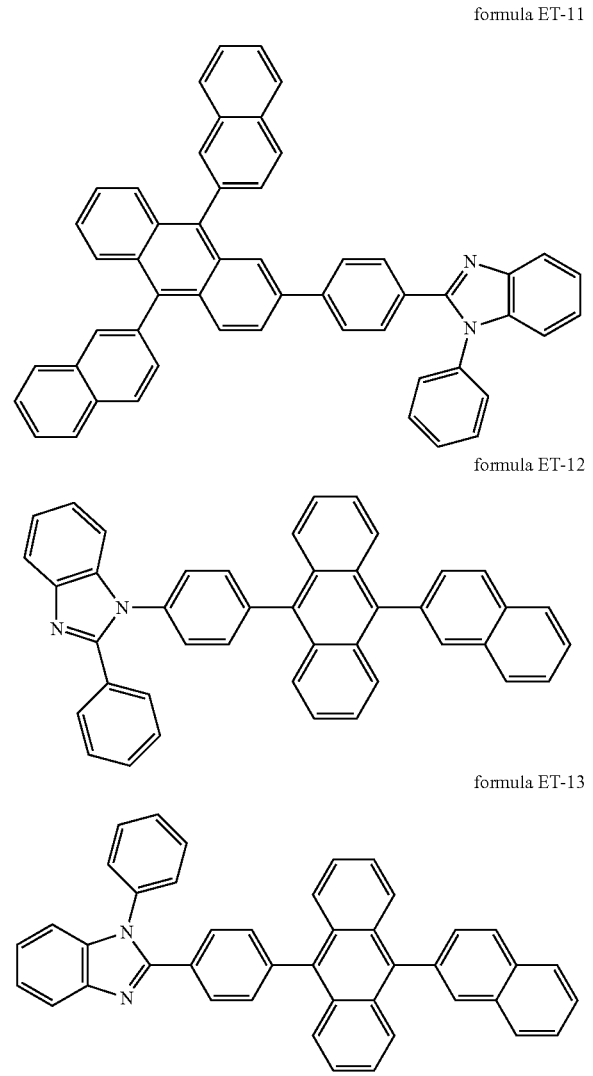

formula ET-11 formula ET-12 formula ET-13

The compounds which are able to generate electron-injection and/or electron-transport properties preferably result in an LUMO of less than −2.5 eV (vs. vacuum level), particularly preferably less than −2.7 eV.

The present formulations may comprise emitters. The term emitter denotes a material which, after excitation, which can take place by transfer of any type of energy, allows a radiative transition into a ground state with emission of light. In general, two classes of emitter are known, namely fluorescent and phosphorescent emitters. The term fluorescent emitter denotes materials or compounds in which a radiative transition from an excited singlet state into the ground state takes place. The term phosphorescent emitter preferably denotes luminescent materials or compounds which contain transition metals.

Emitters are frequently also called dopants if the dopants cause the properties described above in a system. A dopant in a system comprising a matrix material and a dopant is taken to mean the component whose proportion in the mixture is the smaller. Correspondingly, a matrix material in a system comprising a matrix material and a dopant is taken to mean the component whose proportion in the mixture is the greater. Accordingly, the term phosphorescent emitter can also be taken to mean, for example, phosphorescent dopants.

Compounds which are able to emit light include, inter alia, fluorescent emitters and phosphorescent emitters. These include, inter alia, compounds containing stilbene, stilbenamine, styrylamine, coumarine, rubrene, rhodamine, thiazole, thiadiazole, cyanine, thiophene, paraphenylene, perylene, phatalocyanine, porphyrin, ketone, quinoline, imine, anthracene and/or pyrene structures. Particular preference is given to compounds which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding compounds which contain elements from group 8 to 10 (Ru, Os, Rh, Ir, Pd, Pt). Suitable functional compounds here are, for example, various complexes, as described, for example, in WO 02/068435 A1, WO 02/081488 A1, EP 1239526 A2 and WO 2004/026886 A2.

Preferred compounds which can serve as fluorescent emitters are described by way of example below. Preferred fluorescent emitters are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. An arylamine or an aromatic amine in the sense of the present invention is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 2,6- or 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Further preferred fluorescent emitters are selected from indenofluorenamines or indenofluorenediamines, which are described, inter alia, in WO 2006/122630; benzoindenofluorenamines or benzoindenofluorenediamines, which are described, inter alia, in WO 2008/006449; and dibenzoindenofluorenamines or dibenzoindenofluorenediamines, which are described, inter alia, in WO 2007/140847.

Examples of compounds from the class of the styrylamines which can be employed as fluorescent emitters are substituted or unsubstituted tristilbenamines or the dopants described in WO 2006/000388, WO 2006/058737, WO 2006/000389, WO 2007/065549 and WO 2007/115610. Distyrylbenzene and distyrylbiphenyl derivatives are described in U.S. Pat. No. 5,121,029. Further styrylamines can be found in US 2007/0122656 A1.

Particularly preferred styrylamine compounds are the compounds of the formula EM-1 described in U.S. Pat. No. 7,250,532 B2 and the compounds of the formula EM-2 described in DE 10 2005 058557 A1:

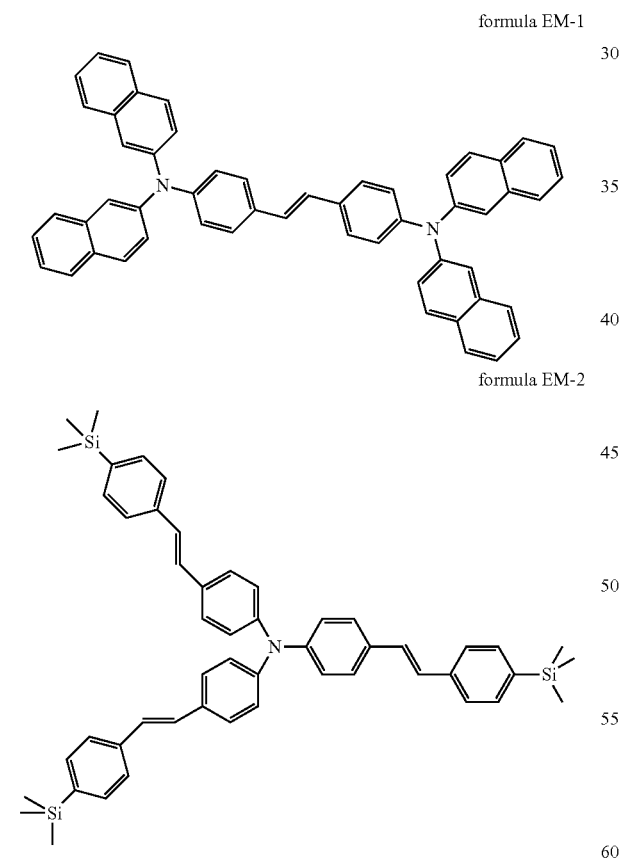

Particularly preferred triarylamine compounds are compounds of the formulae EM-3 to EM-15 disclosed in CN 1583691 A, JP 08/053397 A and U.S. Pat. No. 6,251,531 B1, EP 1957606 A1, US 2008/0113101 A1, US 2006/210830 A, WO 2008/006449 and DE 102008035413 and derivatives thereof:

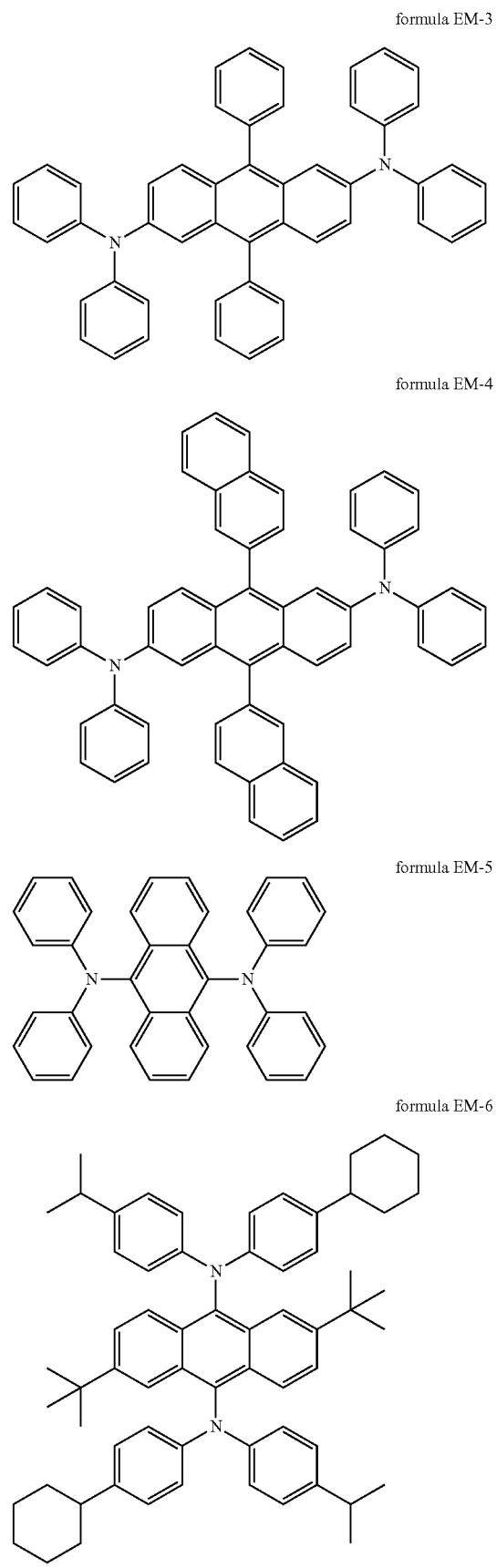

formula EM-7
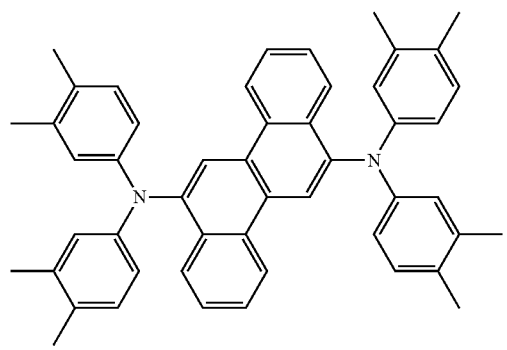
formula EM-11
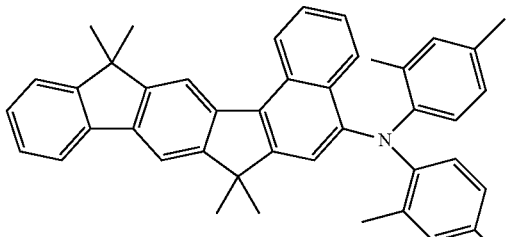
formula EM-8
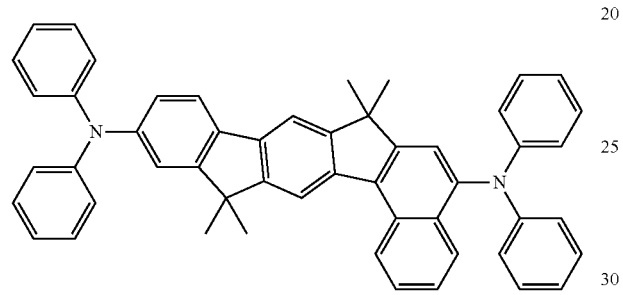
formula EM-12
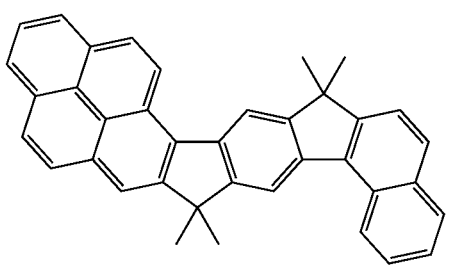
formula EM-9
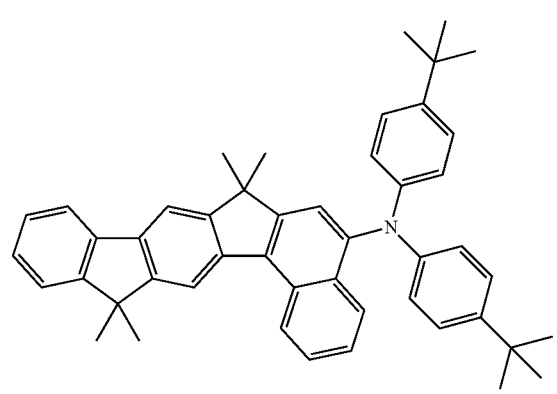
formula EM-13
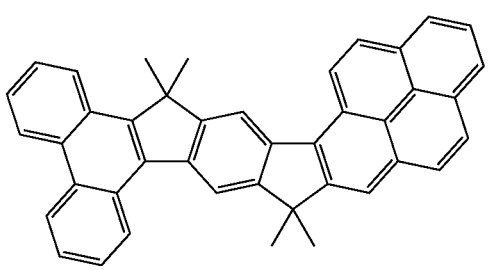
formula EM-14
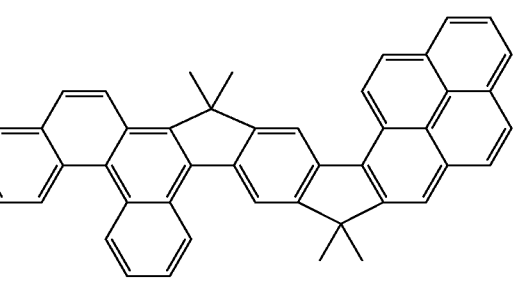
formula EM-10
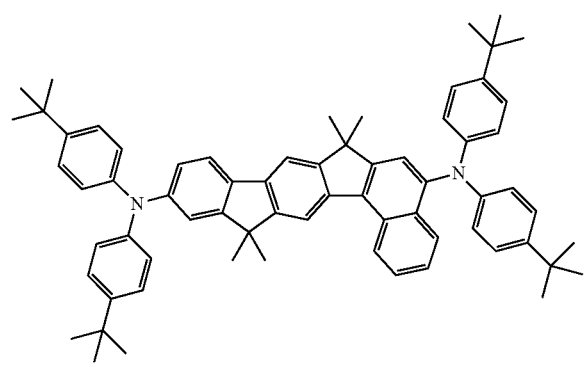
formula EM-15
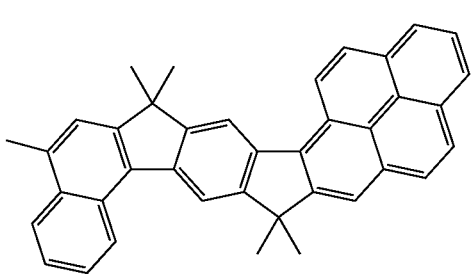
Further preferred compounds which can be employed as fluorescent emitters are selected from derivatives of naphthalene, anthracene, tetracene, benzanthracene, benzophenanthrene (DE 10 2009 005746), fluorene, fluoranthene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. Nos. 4,769,292, 6,020,078, US 2007/0252517 A1), pyran, oxazole, benzoxazole, benzothiazole, benzimidazole, pyrazine, cinnamic acid esters, diketopyrrolopyrrole, acridone and quinacridone (US 2007/0252517 A1).

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)-benzene is also a preferred dopant.

Preference is likewise given to derivatives of rubrene, coumarine, rhodamine, quinacridone, such as, for example, DMQA (=N,N'-dimethylquinacridone), dicyanomethylenepyran, such as, for example, DCM (=4-(dicyanoethylene)-6-(4-dimethylaminostyryl-2-methyl)-4H-pyran), thiopyran, polymethine, pyrylium and thiapyrylium salts, periflanthene and indenoperylene.

Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-bis(9-ethyl-3-carbazovinylene)-1,1'-biphenyl, fluorene, fluoranthene, arylpyrenes (US 2006/0222886 A1), arylenevinylenes (U.S. Pat. Nos. 5,121,029, 5,130,603), bis-(azinyl)imine-boron compounds (US 2007/0092753 A1), bis(azinyl)methene compounds and carbostyryl compounds.

Further preferred blue fluorescent emitters are described in C. H. Chen et al.: "Recent developments in organic electroluminescent materials" Macromol. Symp. 125, (1997) 1-48 and "Recent progress of molecular organic electroluminescent materials and devices" Mat. Sci. and Eng. R, 39 (2002), 143-222.

Further preferred blue-fluorescent emitters are the hydrocarbons disclosed in DE 102008035413.

Preferred compounds which can serve as phosphorescent emitters are described below by way of example.

Examples of phosphorescent emitters are revealed by WO 00/70655, WO 01/41512, WO 02/02714, WO 02/15645, EP 1191613, EP 1191612, EP 1191614 and WO 2005/033244. In general, all phosphorescent complexes as are used in accordance with the prior art for phosphorescent OLEDs and as are known to the person skilled in the art in the area of organic electroluminescence are suitable, and the person skilled in the art will be able to use further phosphorescent complexes without inventive step.

Phosphorescent metal complexes preferably contain Ir, Ru, Pd, Pt, Os or Re.

Preferred ligands are 2-phenylpyridine derivatives, 7,8-benzoquinoline derivatives, 2-(2-thienyl)pyridine derivatives, 2-(1-naphthyl)pyridine derivatives, 1-phenylisoquinoline derivatives, 3-phenylisoquinoline derivatives or 2-phenylquinoline derivatives. All these compounds may be substituted, for example by fluoro, cyano and/or trifluoromethyl substituents for blue. Auxiliary ligands are preferably acetylacetonate or picolinic acid.

In particular, complexes of Pt or Pd with tetradentate ligands of the formula EM-16 are suitable

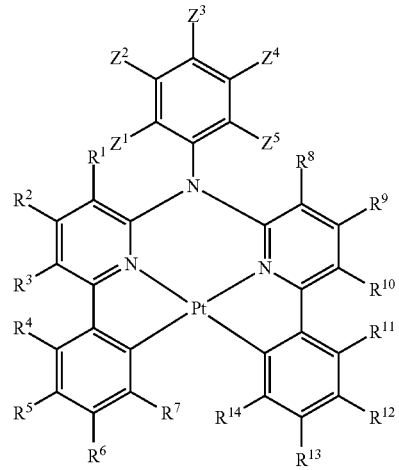

formula EM-16

The compounds of the formula EM-16 are described in greater detail in US 2007/0087219 A1, where, for an explanation of the substituents and indices in the above formula, reference is made to this specification for disclosure purposes. Furthermore, Pt-porphyrin complexes having an enlarged ring system (US 2009/0061681 A1) and Ir complexes, for example 2,3,7,8,12,13,17,18-octaethyl-21H, 23H-porphyrin-Pt(II), tetraphenyl-Pt(II) tetrabenzoporphyrin (US 2009/0061681 A1), cis-bis(2-phenylpyridinato-N, $C^{2'}$)Pt(II), cis-bis(2-(2'-thienyl)pyridinato-N,$C^{3'}$)Pt(II), cis-bis(2-(2'-thienyl)-quinolinato-N,$C^{5'}$)Pt(II), (2-(4,6-difluorophenyl)pyridinato-N,$C^{2'}$)Pt(II) (acetylacetonate), or tris(2-phenylpyridinato-N,$C^{2'}$)Ir(III) (=Ir(ppy)$_3$, green), bis (2-phenylpyridinato-N,$C^{2'}$)Ir(III) (acetylacetonate) (=Ir (ppy)$_2$ acetylacetonate, green, US 2001/0053462 A1, Baldo, Thompson et al. Nature 403, (2000), 750-753), bis(1-phenylisoquinolinato-N,$C^{2'}$)(2-phenylpyridinato-N,$C^{2'}$)-iridium(III), bis(2-phenylpyridinato-N,$C^{2'}$)(1-phenylisoquinolinato-N,$C^{2'}$)-iridium(II), bis(2-(2'-benzothienyl) pyridinato-N,$C^{3'}$)iridium(III) (acetylacetonate), bis(2-(4',6'-difluorophenyl)pydinato-N,$C^{2'}$)iridinat-N,$C^{2'}$)iridium(III) (picolinate) (Flrpic, blue), bis(2-(4',6'-difluorophenyl) pyridinato-N,$C^{2'}$)Ir(III) (tetrakis(1-pyrazolyl)borate), tris(2-(biphenyl-3-yl)-4-tert-butylpyridine)-iridium(III), (ppz)$_2$Ir (5phdpym) (US 2009/0061681 A1), (45ooppz)$_2$-Ir (5phdpym) (US 2009/0061681 A1), derivatives of 2-phenylpyridine-Ir complexes, such as, for example, PQIr (=iridium(III) bis(2-phenylquinolyl-N,$C^{2'}$)acetylacetonate), tris(2-phenylisoquinolinato-N,C)Ir(III) (red), bis(2-(2'-benzo[4,5-a]thienyl)pyridinato-N,$C^3$)Ir (acetylacetonate) ([Btp$_2$Ir(acac)], red, Adachi et al. Appl. Phys. Lett. 78 (2001), 1622-1624).

Likewise suitable are complexes of trivalent lanthanides, such as, for example, Tb$^{3+}$ and Eu$^{3+}$ (J. Kido et al. Appl. Phys. Lett. 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., JACS 105, 1983, 1795), Re(I) tricarbonyl-diimine complexes (Wrighton, JACS 96, 1974, 998, inter alia), Os(II) complexes with cyano ligands and bipyridyl or phenanthroline ligands (Ma et al., Synth. Metals 94, 1998, 245).

Further phosphorescent emitters having tridentate ligands are described in U.S. Pat. No. 6,824,895 and U.S. Ser. No. 10/729,238. Red-emitting phosphorescent complexes are found in U.S. Pat. Nos. 6,835,469 and 6,830,828.

Particularly preferred compounds which are used as phosphorescent dopants are, inter alia, the compounds of the formula EM-17 described, inter alia, in US 2001/0053462 A1 and *Inorg. Chem.* 2001, 40(7), 1704-1711, JACS 2001, 123(18), 4304-4312, and derivatives thereof.

formula EM-17

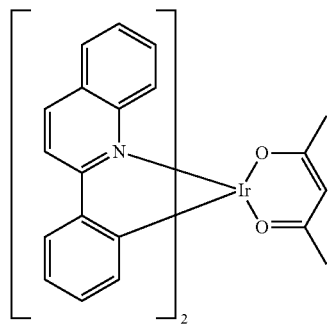

Derivatives are described in U.S. Pat. No. 7,378,162 B2, U.S. Pat. No. 6,835,469 B2 and JP 2003/253145 A.

Furthermore, the compounds of the formulae EM-18 to EM-21 described in U.S. Pat. No. 7,238,437 B2, US 2009/008607 A1 and EP 1348711, and derivatives thereof, can be employed as emitters.

formula EM-18

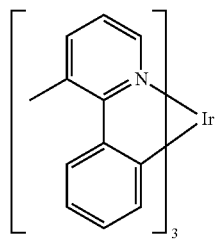

formula EM-19

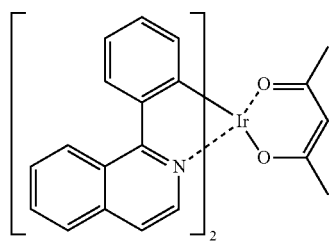

formula EM-20

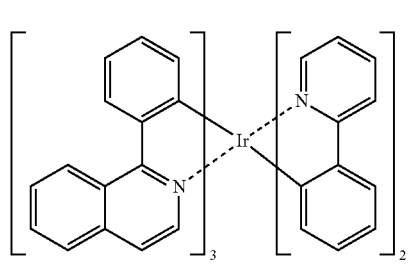

formula EM-21

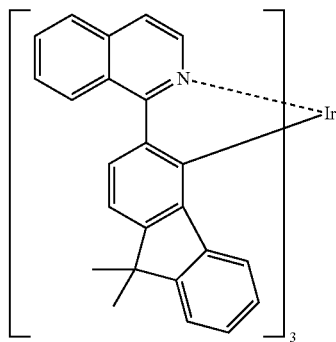

Quantum dots can likewise be employed as emitters, these materials being disclosed in detail in WO 2011/076314 A1.

Compounds which are employed as host materials, in particular together with emitting compounds, include materials from various classes of substance.

Host materials generally have larger band gaps between HOMO and LUMO than the emitter materials employed. In addition, preferred host materials exhibit properties of either a hole- or electron-transport material. Furthermore, host materials can have both electron- and hole-transport properties.

Host materials are in some cases also called matrix material, in particular if the host material is employed in combination with a phosphorescent emitter in an OLED.

Preferred host materials or co-host materials, which are employed, in particular, together with fluorescent dopants, are selected from the classes of the oligoarylenes (for example 2,2',7,7'-tetraphenylspirobifluorene in accordance with EP 676461 or dinaphthylanthracene), in particular the oligoarylenes containing condensed aromatic groups, such as, for example, anthracene, benzanthracene, benzophenanthrene (DE 10 2009 005746, WO 2009/069566), phenanthrene, tetracene, coronene, chrysene, fluorene, spirofluorene, perylene, phthaloperylene, naphthaloperylene, decacyclene, rubrene, the oligoarylenevinylenes (for example DPVBi=4,4'-bis(2,2-diphenylethenyl)-1,1'-biphenyl or spiro-DPVBi in accordance with EP 676461), the polypodal metal complexes (for example in accordance with WO 04/081017), in particular metal complexes of 8-hydroxyquinoline, for example AlQ$_3$ (=aluminium(III) tris(8-hydroxyquinoline)) or bis(2-methyl-8-quinolinolato)-4-(phenylphenolinolato)aluminium, also with imidazole chelate (US 2007/0092753 A1) and the quinoline-metal complexes, aminoquinoline-metal complexes, benzoquinoline-metal complexes, the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239).

Particularly preferred compounds which can serve as host materials or co-host materials are selected from the classes of the oligoarylenes, comprising anthracene, benzanthracene and/or pyrene, or atropisomers of these compounds. An oligoarylene in the sense of the present invention is intended to be taken to mean a compound in which at least three aryl or arylene groups are bonded to one another.

Preferred host materials are selected, in particular, from compounds of the formula (H-1), $$Ar^4—(Ar^5)_p—Ar^6 \qquad (H-1)$$

where $Ar^4$, $Ar^5$, $Ar^6$ are on each occurrence, identically or differently, an aryl or heteroaryl group having 5 to 30 aromatic ring atoms, which may optionally be substituted, and p represents an integer in the range from 1 to 5; the sum of the π electrons in $Ar^4$, $Ar^5$ and $Ar^6$ is at least 30 if p=1 and at least 36 if p=2 and at least 42 if p=3.

In the compounds of the formula (H-1), the group $Ar^5$ particularly preferably stands for anthracene, and the groups $Ar^4$ and $Ar^6$ are bonded in the 9- and 10-position, where these groups may optionally be substituted. Very particularly preferably, at least one of the groups $Ar^4$ and/or $Ar^6$ is a condensed aryl group selected from 1- or 2-naphthyl, 2-, 3- or 9-phenanthrenyl or 2-, 3-, 4-, 5-, 6- or 7-benzanthracenyl. Anthracene-based compounds are described in US 2007/0092753 A1 and US 2007/0252517 A1, for example 2-(4-methylphenyl)-9,10-di-(2-naphthyl)anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to compounds containing two anthracene units (US 2008/0193796 A1), for example 10,10'-bis[1,1',4',1"]terphenyl-2-yl-9,9'-bisanthracenyl.

Further preferred compounds are derivatives of arylamine, styrylamine, fluorescein, diphenylbutadiene, tetraphenylbutadiene, cyclopentadiene, tetraphenylcyclopentadiene, pentaphenylcyclopentadiene, coumarine, oxadiazole, bisbenzoxazoline, oxazole, pyridine, pyrazine, imine, benzothiazole, benzoxazole, benzimidazole (US 2007/0092753 A1), for example 2,2',2"-(1,3,5-phenylene)tris[1-phenyl-1H-benzimidazole], aldazine, stilbene, styrylarylene derivatives, for example 9,10-bis[4-(2,2-diphenylethenyl)phenyl]anthracene, and distyrylarylene derivatives (U.S. Pat. No. 5,121,029), diphenylethylene, vinylanthracene, diaminocarbazole, pyran, thiopyran, diketopyrrolopyrrole, polymethine, cinnamic acid esters and fluorescent dyes.

Particular preference is given to derivatives of arylamine and styrylamine, for example TNB (=4,4'-bis[N-(1-naphthyl)-N-(2-naphthyl)amino]biphenyl), Metal-oxinoid complexes, such as LiQ or $AlQ_3$, can be used as co-hosts.

Preferred compounds with oligoarylene as matrix are disclosed in US 2003/0027016 A1, U.S. Pat. No. 7,326,371 B2, US 2006/043858 A, WO 2007/114358, WO 2008/145239, JP 3148176 B2, EP 1009044, US 2004/018383, WO 2005/061656 A1, EP 0681019B1, WO 2004/013073A1, U.S. Pat. No. 5,077,142, WO 2007/065678 and DE 102009005746, where particularly preferred compounds are described by the formulae H-2 to H-8.

formula H-2

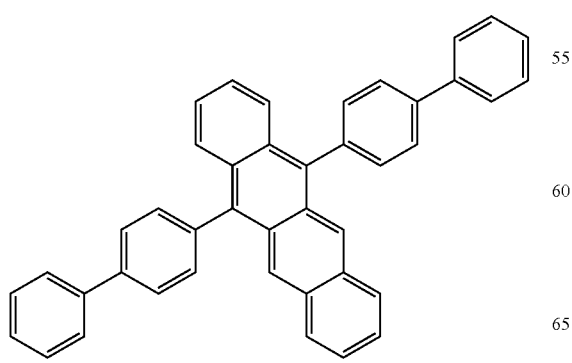

formula H-3

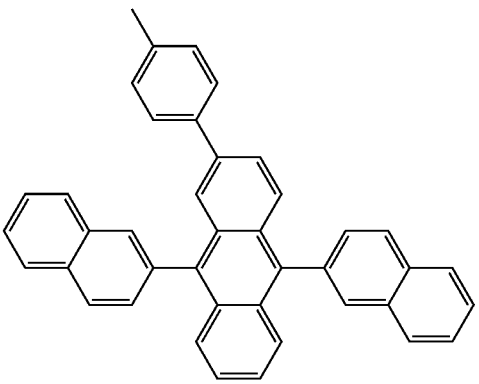

formula H-4

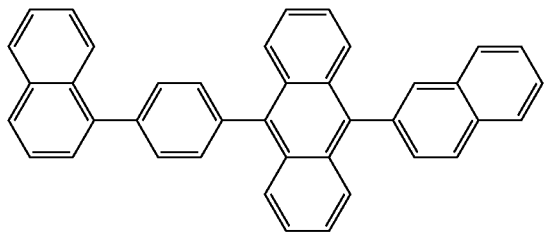

formula H-5

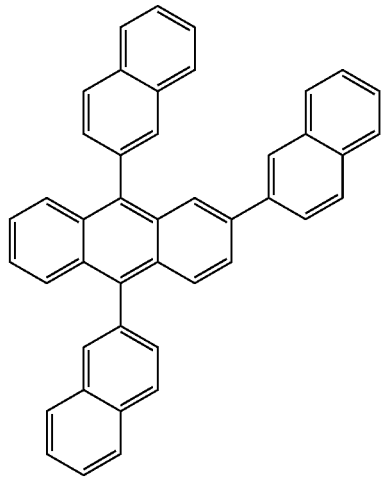

formula H-6

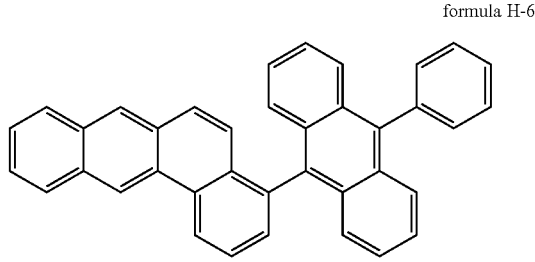

formula H-7

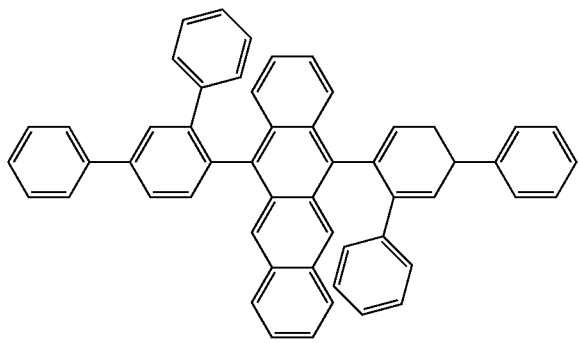

formula H-8

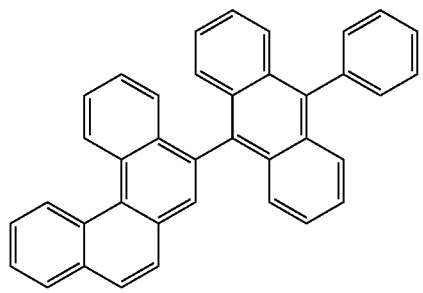

Furthermore, compounds which can be employed as host or matrix include materials which are employed together with phosphorescent emitters. These compounds, which can also be employed as structural elements in polymers, include CBP (N,N-biscarbazolylbiphenyl), carbazole derivatives (for example in accordance with WO 2005/039246, US 2005/0069729, JP 2004/288381, EP 1205527 or WO 2008/086851), azacarbazoles (for example in accordance with EP 1617710, EP 1617711, EP 1731584 or JP 2005/347160), ketones (for example in accordance with WO 2004/093207 or in accordance with DE 102008033943), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (for example in accordance with DE 102008017591), azaboroles or boronic esters (for example in accordance with WO 2006/117052), triazine derivatives (for example in accordance with DE 102008036982), indolocarbazole derivatives (for example in accordance with WO 2007/063754 or WO 2008/056746), indenocarbazole derivatives (for example in accordance with DE 102009023155 and DE 102009031021), diazaphosphole derivatives (for example in accordance with DE 102009022858), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodimide derivatives, metal complexes of 8-hydroxyquinoline derivatives, such as, for example, $AlQ_3$, which may also contain triarylaminophenol ligands (US 2007/0134514 A1), metal complex/polysilane compounds, and thiophene, benzothiophene and dibenzothiophene derivatives.

Examples of preferred carbazole derivatives are mCP (=1,3-N,N-dicarbazolylbenzene (=9,9'-(1,3-phenylene)bis-9H-carbazole)) (formula H-9), CDBP (=9,9'-(2,2'-dimethyl [1,1'-biphenyl]-4,4'-diyl)bis-9H-carbazole), 1,3-bis(N,N'-dicarbazolyl)benzene (=1,3-bis(carbazol-9-yl)benzene), PVK (polyvinylcarbazole), 3,5-di(9H-carbazol-9-yl)biphenyl and CMTTP (formula H-10). Particularly referred compounds are disclosed in US 2007/0128467 A1 and US 2005/0249976 A1 (formulae H-11 and H-13).

formula H-9

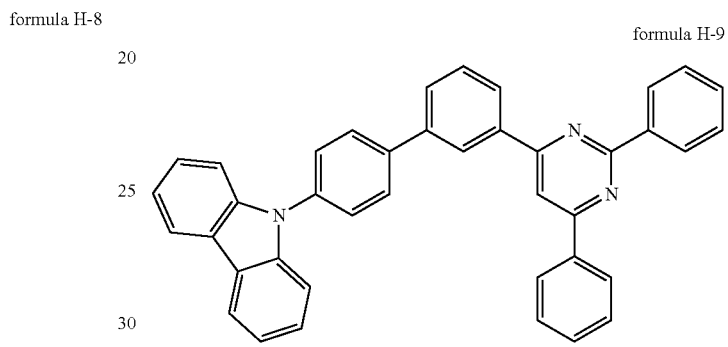

formula H-10

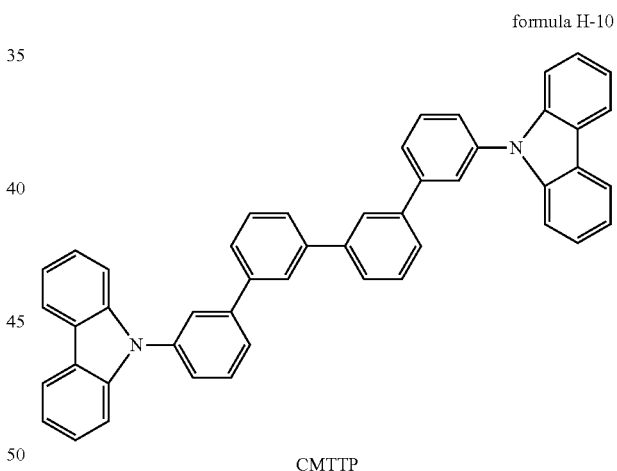

CMTTP formula H-11

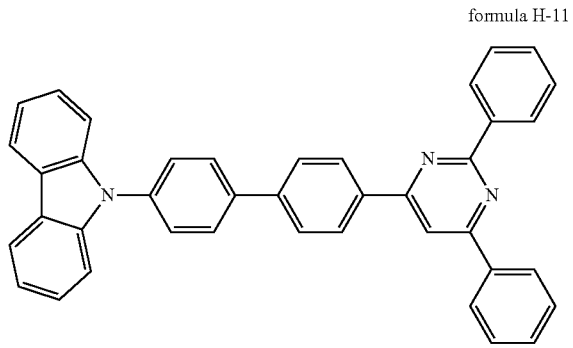

formula H-12

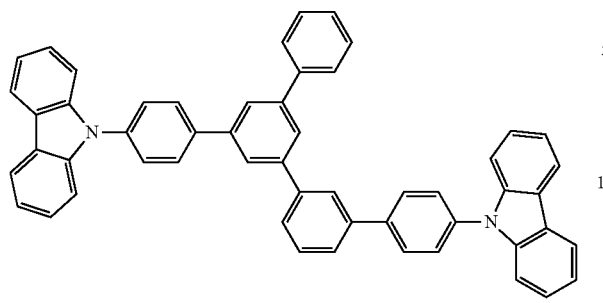

formula H-13

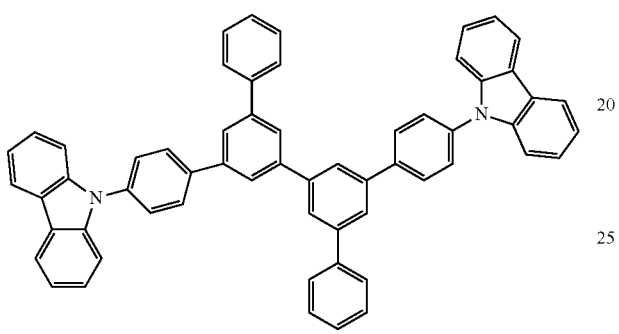

Preferred tetraaryl-Si compounds are disclosed, for example, in US 2004/0209115, US 2004/0209116, US 2007/0087219 A1 and in H. Gilman, E. A. Zuech, Chemistry & Industry (London, United Kingdom), 1960, 120.

Particularly preferred tetraaryl-Si compounds are described by the formulae H-14 to H-21.

formula H-14

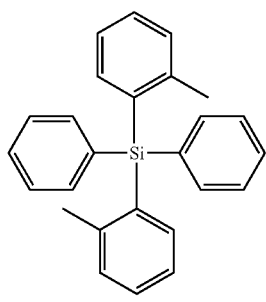

UGH1 formula H-15

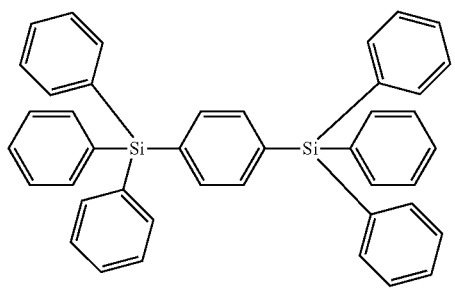

UGH2 formula H-16

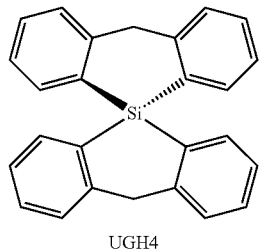

UGH4 formula H-17

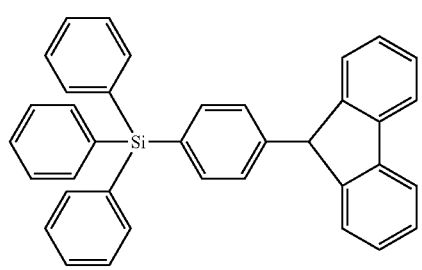

TPSi—F
Triphenyl-[4-(9-phenyl-9H-fluoren-9-yl)phenyl]silane formula H-18

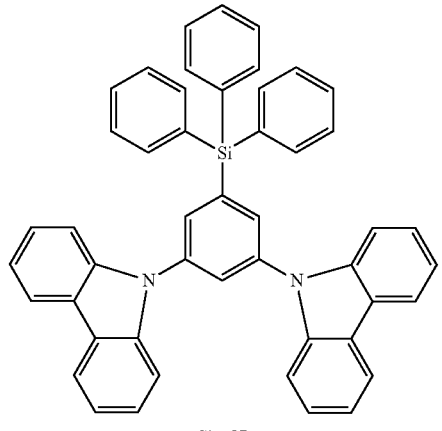

SimCP formula H-19

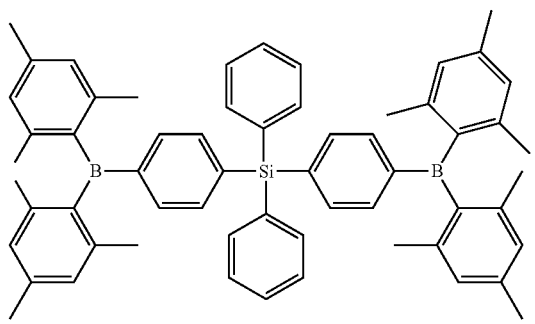

formula H-20

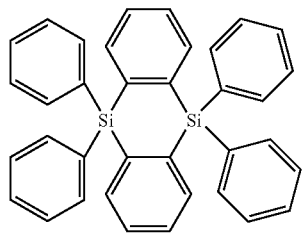

formula H-24

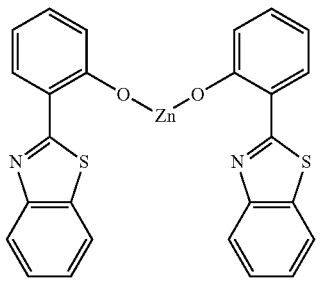

formula H-21

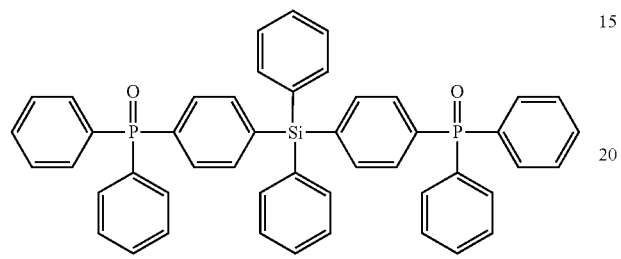

formula H-25

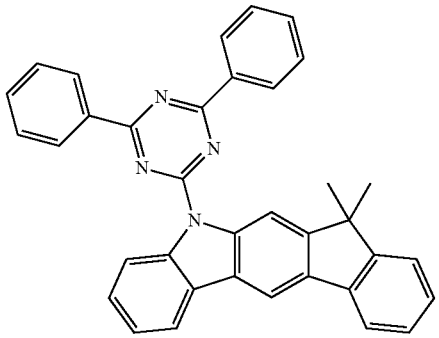

Particularly preferred compounds from group 4 for the preparation of the matrix for phosphorescent dopants are disclosed, inter alia, in DE 102009022858, DE 102009023155, EP 652273 B1, WO 2007/063754 and WO 2008/056746, where particularly preferred compounds are described by the formulae H-22 to H-25.

formula H-22

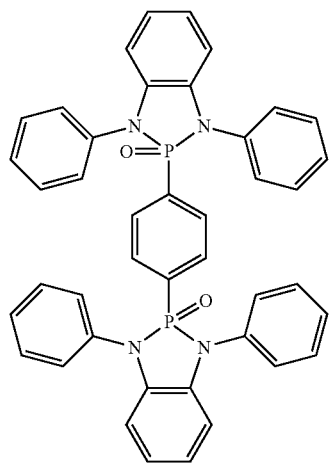

formula H-23

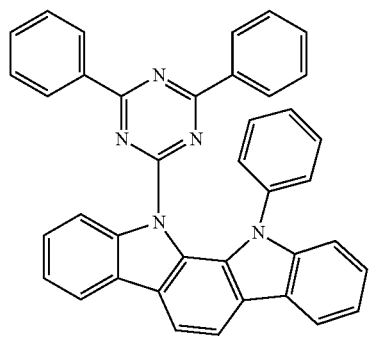

With respect to the functional compounds which can be employed in accordance with the invention and which can serve as host material, especial preference is given to substances which contain at least one nitrogen atom. These preferably include aromatic amines, triazine derivatives and carbazole derivatives. Thus, carbazole derivatives in particular exhibit surprisingly high efficiency. Triazine derivatives result in unexpectedly long lifetimes of the electronic devices.

It may also be preferred to employ a plurality of different matrix materials as a mixture, in particular at least one electron-conducting matrix material and at least one hole-conducting matrix material. Preference is likewise given to the use of a mixture of a charge-transporting matrix material and an electrically inert matrix material which is not involved in the charge transport to a significant extent, if at all, as described, for example, in WO 2010/108579.

It is furthermore possible to employ compounds which improve the transition from the singlet state to the triplet state and which, employed in support of the functional compounds having emitter properties, improve the phosphorescence properties of these compounds. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

n-Dopants herein are taken to mean reducing agents, i.e. electron donors. Preferred examples of n-dopants are W(hpp)$_4$ and other electron-rich metal complexes in accordance with WO 2005/086251 A2, P=N compounds (for example WO 2012/175535 A1, WO 2012/175219 A1), naphthylenecarbodiimides (for example WO 2012/168358 A1), fluorenes (for example WO 2012/031735 A1), free radicals and diradicals (for example EP 1837926 A1, WO 2007/107306 A1), pyridines (for example EP 2452946 A1, EP 2463927 A1), N-heterocyclic compounds (for example WO 2009/000237 A1) and acridines as well as phenazines (for example US 2007/145355 A1).

Furthermore, the formulations may comprise a wide-band-gap material as functional material. Wide-band-gap material is taken to mean a material in the sense of the disclosure content of U.S. Pat. No. 7,294,849. These systems exhibit particularly advantageous performance data in electroluminescent devices.

The compound employed as wide-band-gap material can preferably have a band gap of 2.5 eV or more, preferably 3.0 eV or more, particularly preferably 3.5 eV or more. The band gap can be calculated, inter alia, by means of the energy levels of the highest occupied molecular orbital (HOMO) and the lowest unoccupied molecular orbital (LUMO).

Furthermore, the formulations may comprise a hole-blocking material (HBM) as functional material. A hole-blocking material denotes a material which prevents or minimises the transmission of holes (positive charges) in a multilayer system, in particular if this material is arranged in the form of a layer adjacent to an emission layer or a hole-conducting layer. In general, a hole-blocking material has a lower HOMO level than the hole-transport material in the adjacent layer. Hole-blocking layers are frequently arranged between the light-emitting layer and the electron-transport layer in OLEDs.

It is basically possible to employ any known hole-blocking material. In addition to other hole-blocking materials described elsewhere in the present application, advantageous hole-blocking materials are metal complexes (US 2003/0068528), such as, for example, bis(2-methyl-8-quinolinolato)(4-phenylphenolato)aluminium(II) (BAlQ). Fac-tris(1-phenylpyrazolato-N,C2)-iridium(III) (Ir(ppz)$_3$) is likewise employed for this purpose (US 2003/0175553 A1). Phenanthroline derivatives, such as, for example, BCP, or phthalimides, such as, for example, TMPP, can likewise be employed.

Furthermore, advantageous hole-blocking materials are described in WO 00/70655 A2, WO 01/41512 and WO 01/93642 A1.

Furthermore, the formulations may comprise an electron-blocking material (EBM) as functional material. An electron-blocking material denotes a material which prevents or minimises the transmission of electrons in a multilayer system, in particular if this material is arranged in the form of a layer adjacent to an emission layer or an electron-conducting layer. In general, an electron-blocking material has a higher LUMO level than the electron-transport material in the adjacent layer.

It is basically possible to employ any known electron-blocking material. In addition to other electron-blocking materials described elsewhere in the present application, advantageous electron-blocking materials are transition-metal complexes, such as, for example, Ir(ppz)$_3$ (US 2003/0175553).

The electron-blocking material can preferably be selected from amines, triarylamines and derivatives thereof.

Furthermore, the functional compounds which can be employed as organofunctional materials in the formulations preferably have, if they are low-molecular-weight compounds, a molecular weight of ≤3000 g/mol, particularly preferably ≤2000 g/mol and especially preferably ≤1000 g/mol.

Of particular interest are furthermore functional compounds which are distinguished by a high glass-transition temperature. In this connection, particularly preferred functional compounds which can be employed as organofunctional material in the formulations are those which have a glass-transition temperature of ≥70° C., preferably ≥100° C., particularly preferably ≥125° C. and especially preferably ≥150° C., determined in accordance with DIN 51005.

The formulations may also comprise polymers as organofunctional materials. The compounds described above as organofunctional materials, which frequently have a relatively low molecular weight, can also be mixed with a polymer. It is likewise possible to incorporate these compounds covalently into a polymer. This is possible, in particular, with compounds which are substituted by reactive leaving groups, such as bromine, iodine, chlorine, boronic acid or boronic acid ester, or by reactive, polymerisable groups, such as olefins or oxetanes. These can be used as monomers for the production of corresponding oligomers, dendrimers or polymers. The oligomerisation or polymerisation here preferably takes place via the halogen functionality or the boronic acid functionality or via the polymerisable group. It is furthermore possible to crosslink the polymers via groups of this type. The compounds and polymers according to the invention can be employed as crosslinked or uncrosslinked layer.

Polymers which can be employed as organofunctional materials frequently contain units or structural elements which have been described in the context of the compounds described above, inter alia those as disclosed and extensively listed in WO 02/077060 A1, in WO 2005/014689 A2 and in WO 2011/076314 A1. These are incorporated into the present application by way of reference. The functional materials can originate, for example, from the following classes:

Group 1: structural elements which are able to generate hole-injection and/or hole-transport properties;
Group 2: structural elements which are able to generate electron-injection and/or electron-transport properties;
Group 3: structural elements which combine the properties described in relation to groups 1 and 2;
Group 4: structural elements which have light-emitting properties, in particular phosphorescent groups;
Group 5: structural elements which improve the transition from the so-called singlet state to the triplet state;
Group 6: structural elements which influence the morphology or also the emission colour of the resultant polymers;
Group 7: structural elements which are typically used as backbone.

The structural elements here may also have various functions, so that a clear assignment need not be advantageous. For example, a structural element of group 1 may likewise serve as backbone.

The polymer having hole-transport or hole-injection properties employed as organofunctional material, containing structural elements from group 1, may preferably contain units which correspond to the hole-transport or hole-injection materials described above.

Further preferred structural elements of group 1 are, for example, triarylamine, benzidine, tetraaryl-para-phenylene-diamine, carbazole, azulene, thiophene, pyrrole and furan derivatives and further O-, S- or N-containing heterocycles having a high HOMO. These arylamines and heterocycles preferably have an HOMO of above −5.8 eV (against vacuum level), particularly preferably above −5.5 eV.

Preference is given, inter alia, to polymers having hole-transport or hole-injection properties, containing at least one of the following recurring units of the formula HTP-1:

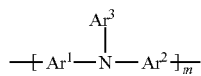
HTP-1 in which the symbols have the following meaning:
Ar¹ is, in each case identically or differently for different recurring units, a single bond or a monocyclic or polycyclic aryl group, which may optionally be substituted;
Ar² is, in each case identically or differently for different recurring units, a monocyclic or polycyclic aryl group, which may optionally be substituted;
Ar³ is, in each case identically or differently for different recurring units, a monocyclic or polycyclic aryl group, which may optionally be substituted;
m is 1, 2 or 3.

Particular preference is given to recurring units of the formula HTP-1 which are selected from the group consisting of units of the formulae HTP-1A to HTP-1C:

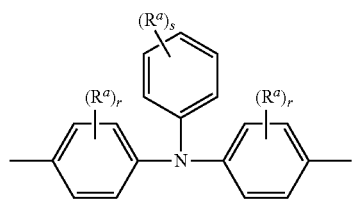
HTP-1A

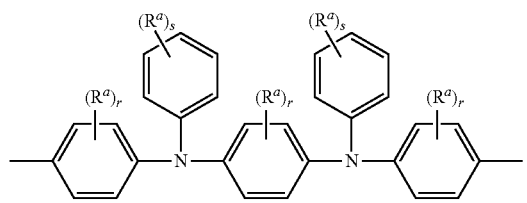
HTP-1B

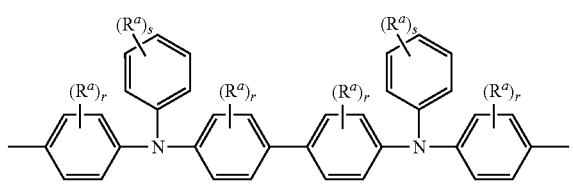
HTP-1C in which the symbols have the following meaning:
$R^a$ is on each occurrence, identically or differently, H, a substituted or unsubstituted aromatic or heteroaromatic group, an alkyl, cycloalkyl, alkoxy, aralkyl, aryloxy, arylthio, alkoxycarbonyl, silyl or carboxyl group, a halogen atom, a cyano group, a nitro group or a hydroxyl group;
r is 0, 1, 2, 3 or 4, and
s is 0, 1, 2, 3, 4 or 5.

Preference is given, inter alia, to polymers having hole-transport or hole-injection properties, containing at least one of the following recurring units of the formula HTP-2:

HTP-2 in which the symbols have the following meaning:
$T^1$ and $T^2$ are selected independently from thiophene, selenophene, thieno-[2,3-b]thiophene, thieno[3,2-b]thiophene, dithienothiophene, pyrrole and aniline, where these groups may be substituted by one or more radicals $R^b$;
$R^b$ is selected independently on each occurrence from halogen, —CN, —NC, —NCO, —NCS, —OCN, —SCN, —C(=O)NR°R°°, —C(=O)X, —C(=O)R°, —NH₂, —NR°R°°, —SH, —SR°, —SO₃H, —SO₂R°, —OH, —NO₂, —CF₃, —SF₅, an optionally substituted silyl, carbyl or hydrocarbyl group having 1 to 40 carbon atoms, which may optionally be substituted and may optionally contain one or more heteroatoms;
$R°$ and $R°°$ are each independently H or an optionally substituted carbyl or hydrocarbyl group having 1 to 40 carbon atoms, which may optionally be substituted and may optionally contain one or more heteroatoms;
$Ar^7$ and $Ar^8$ represent, independently of one another, a monocyclic or polycyclic aryl or heteroaryl group, which may optionally be substituted and may optionally be bonded to the 2,3-position of one or both adjacent thiophene or selenophene groups;
c and e are, independently of one another, 0, 1, 2, 3 or 4, where 1<c+e≤6;
d and f are, independently of one another, 0, 1, 2, 3 or 4.

Preferred examples of polymers having hole-transport or hole-injection properties are described, inter alia, in WO 2007/131582 A1 and WO 2008/009343 A1.

The polymer having electron-injection and/or electron-transport properties employed as organofunctional material, containing structural elements from group 2, may preferably contain units which correspond to the electron-injection and/or electron-transport materials described above.

Further preferred structural elements of group 2 which have electron-injection and/or electron-transport properties are derived, for example, from pyridine, pyrimidine, pyridazine, pyrazine, oxadiazole, quinoline, quinoxaline and phenazine groups, but also triarylborane groups or further O-, S- or N-containing heterocycles having a low LUMO level. These structural elements of group 2 preferably have an LUMO of below −2.7 eV (against vacuum level), particularly preferably below −2.8 eV.

The organofunctional material can preferably be a polymer which contains structural elements from group 3, where structural elements which improve the hole and electron mobility (i.e. structural elements from groups 1 and 2) are connected directly to one another. Some of these structural elements can serve as emitters here, where the emission colours may be shifted, for example, into the green, red or yellow. Their use is therefore advantageous, for example, for the generation of other emission colours or a broad-band emission by polymers which originally emit in blue.

The polymer having light-emitting properties employed as organofunctional material, containing structural elements from group 4, may preferably contain units which correspond to the emitter materials described above. Preference is given here to polymers containing phosphorescent groups, in particular the emitting metal complexes described above which contain corresponding units containing elements from groups 8 to 10 (Ru, Os, Rh, Ir, Pd, Pt).

The polymer employed as organofunctional material containing units of group 5 which improve the transition from the so-called singlet state to the triplet state can preferably be employed in support of phosphorescent compounds, preferably the polymers containing structural elements of group 4 described above. A polymeric triplet matrix can be used here.

Suitable for this purpose are, in particular, carbazole and connected carbazole dimer units, as described, for example, in DE 10304819 A1 and DE 10328627 A1. Also suitable for this purpose are ketone, phosphine oxide, sulfoxide, sulfone and silane derivatives and similar compounds, as described, for example, in DE 10349033 A1. Furthermore, preferred structural units can be derived from compounds which have been described above in connection with the matrix materials employed together with phosphorescent compounds.

The further organic functional material is preferably a polymer containing units of group 6 which influence the morphology and/or the emission colour of the polymers. Besides the polymers mentioned above, these are those which have at least one further aromatic or another conjugated structure which do not count amongst the above-mentioned groups. These groups accordingly have only little or no effect on the charge-carrier mobilities, the non-organometallic complexes or the singlet-triplet transition.

Structural units of this type are able to influence the morphology and/or the emission colour of the resultant polymers. Depending on the structural unit, these polymers can therefore also be used as emitters.

In the case of fluorescent OLEDs, preference is therefore given to aromatic structural elements having 6 to 40 C atoms or also tolan, stilbene or bisstyrylarylene derivative units, each of which may be substituted by one or more radicals. Particular preference is given here to the use of groups derived from 1,4-phenylene, 1,4-naphthylene, 1,4- or 9,10-anthrylene, 1,6-, 2,7- or 4,9-pyrenylene, 3,9- or 3,10-perylenylene, 4,4'-biphenylene, 4,4''-terphenylylene, 4,4'-bi-1,1'-naphthylylene, 4,4'-tolanylene, 4,4'-stilbenylene or 4,4''-bisstyrylarylene derivatives.

The polymer employed as organofunctional material preferably contains units of group 7, which preferably contain aromatic structures having 6 to 40 C atoms which are frequently used as backbone.

These include, inter alia, 4,5-dihydropyrene derivatives, 4,5,9,10-tetrahydropyrene derivatives, fluorene derivatives, which are disclosed, for example, in U.S. Pat. No. 5,962, 631, WO 2006/052457 A2 and WO 2006/118345 A1, 9,9-spirobifluorene derivatives, which are disclosed, for example, in WO 2003/020790 A1, 9,10-phenanthrene derivatives, which are disclosed, for example, in WO 2005/104264 A1, 9,10-dihydrophenanthrene derivatives, which are disclosed, for example, in WO 2005/014689 A2, 5,7-dihydrodibenzoxepine derivatives and cis- and trans-indenofluorene derivatives, which are disclosed, for example, in WO 2004/041901 A1 and WO 2004/113412 A2, and binaphthylene derivatives, which are disclosed, for example, in WO 2006/063852 A1, and further units which are disclosed, for example, in WO 2005/056633 A1, EP 1344788 A1, WO 2007/043495 A1, WO 2005/033174 A1, WO 2003/099901 A1 and DE 102006003710.

Particular preference is given to structural units of group 7 which are selected from fluorene derivatives, which are disclosed, for example, in U.S. Pat. No. 5,962,631, WO 2006/052457 A2 and WO 2006/118345 A1, spirobifluorene derivatives, which are disclosed, for example, in WO 2003/020790 A1, benzofluorene, dibenzofluorene, benzothiophene and dibenzofluorene groups and derivatives thereof, which are disclosed, for example, in WO 2005/056633 A1, EP 1344788 A1 and WO 2007/043495 A1.

Especially preferred structural elements of group 7 are represented by the general formula PB-1:

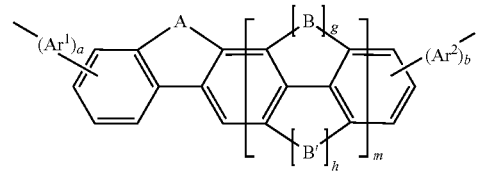

formula PB-1 in which the symbols and indices have the following meanings:

A, B and B' are each, also for different recurring units, identically or differently, a divalent group, which is preferably selected from —$CR^cR^d$—, —$NR^c$—, —$PR^c$—, —O—, —S—, —SO—, —$SO_2$—, —CO—, —CS—, —CSe—, —P(=O)$R^c$—, —P(=S)$R^c$— and —$SiR^cR^d$—;

$R^c$ and $R^d$ are selected on each occurrence, independently, from H, halogen, —CN, —NC, —NCO, —NCS, —OCN, —SCN, —C(=O)$NR^oR^{oo}$, —C(=O)X, —C(=O)$R^o$, —$NH_2$, —$NR^oR^{oo}$, —SH, —$SR^o$, —$SO_3H$, —$SO_2R^o$, —OH, —$NO_2$, —$CF_3$, —$SF_5$, an optionally substituted silyl, carbyl or hydrocarbyl group having 1 to 40 carbon atoms, which may optionally be substituted and may optionally contain one or more heteroatoms, where the groups $R^c$ and $R^d$ may optionally form a spiro group with a fluorene radical to which they are bonded;

X is halogen;

$R^o$ and $R^{oo}$ are each, independently, H or an optionally substituted carbyl or hydrocarbyl group having 1 to 40 carbon atoms, which may optionally be substituted and may optionally contain one or more heteroatoms;

g is in each case, independently, 0 or 1 and h is in each case, independently, 0 or 1, where the sum of g and h in a sub-unit is preferably 1;

m is an integer≥1;

$Ar^1$ and $Ar^2$ represent, independently of one another, a monocyclic or polycyclic aryl or heteroaryl group, which may optionally be substituted and may optionally be bonded to the 7,8-position or the 8,9-position of an indenofluorene group;

a and b are, independently of one another, 0 or 1.

If the groups $R^c$ and $R^d$ form a spiro group with the fluorene group to which these groups are bonded, this group preferably represents a spirobifluorene.

Particular preference is given to recurring units of the formula PB-1 which are selected from the group consisting of units of the formulae PB-1A to PB-1E:

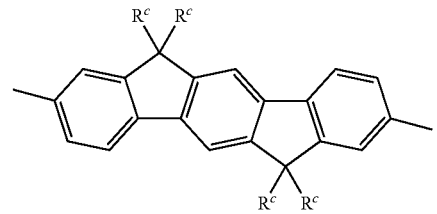

formula PB-1A

-continued

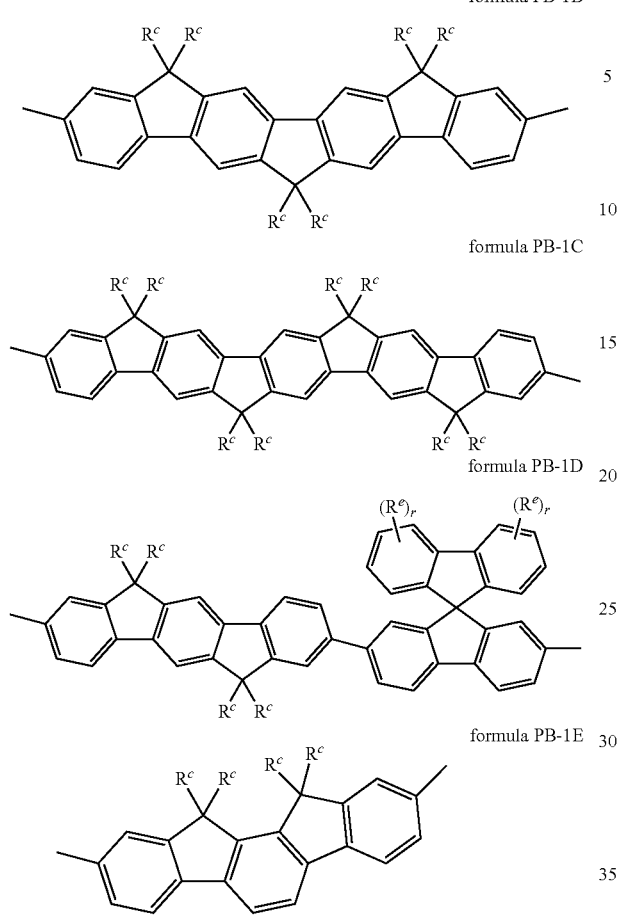

formula PB-1B formula PB-1C formula PB-1D formula PB-1E where $R^c$ has the meaning described above for formula PB-1, r is 0, 1, 2, 3 or 4, and $R^e$ has the same meaning as the radical $R^c$.

$R^e$ is preferably —F, —Cl, —Br, —I, —CN, —NO$_2$, —NCO, —NCS, —OCN, —SCN, —C(=O)NR$^0$R$^{00}$, —C(=O)X, —C(=O)R$^0$, —NR$^0$R$^{00}$, an optionally substituted silyl-, aryl- or heteroaryl group having 4 to 40, preferably 6 to 20, C atoms, or a straight-chain, branched or cyclic alkyl, alkoxy, alkylcarbonyl, alkoxycarbonyl, alkylcarbonyloxy or alkoxycarbonyloxy group having 1 to 20, preferably 1 to 12, C atoms, where one or more hydrogen atoms may optionally be substituted by F or Cl, and the groups $R^0$, $R^{00}$ and X have the meaning described above for formula PB-1.

Particular preference is given to recurring units of the formula PB-1 which are selected from the group consisting of units of the formulae PB-1F to PB-1I:

formula PB-1F

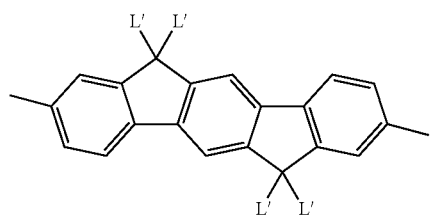

-continued

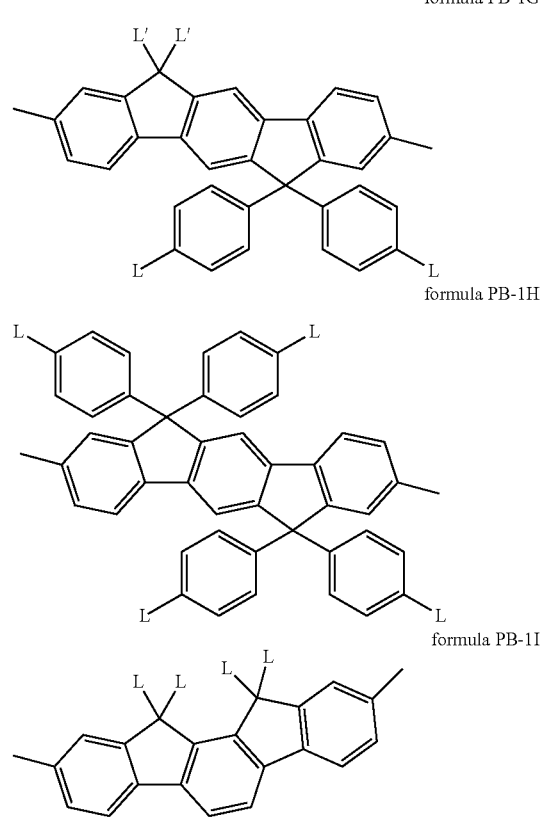

formula PB-1G formula PB-1H formula PB-1I in which the symbols have the following meaning:
L is H, halogen or an optionally fluorinated, linear or branched alkyl or alkoxy group having 1 to 12 C atoms and preferably stands for H, F, methyl, i-propyl, t-butyl, n-pentoxy or trifluoromethyl; and
L' is an optionally fluorinated, linear or branched alkyl or alkoxy group having 1 to 12 C atoms and preferably stands for n-octyl or n-octyloxy.

For carrying out the present invention, preference is given to polymers which contain more than one of the structural elements of groups 1 to 7 described above. It may furthermore be provided that the polymers preferably contain more than one of the structural elements from one group described above, i.e. comprise mixtures of structural elements selected from one group.

Particular preference is given, in particular, to polymers which, besides at least one structural element which has light-emitting properties (group 4), preferably at least one phosphorescent group, additionally contain at least one further structural element of groups 1 to 3, 5 or 6 described above, where these are preferably selected from groups 1 to 3.

The proportion of the various classes of groups, if present in the polymer, can be in broad ranges, where these are known to the person skilled in the art. Surprising advantages can be achieved if the proportion of one class present in a polymer, which is in each case selected from the structural elements of groups 1 to 7 described above, is preferably in each case ≥5 mol %, particularly preferably in each case ≥10 mol %.

The preparation of white-emitting copolymers is described in detail, inter alia, in DE 10343606 A1.

In order to improve the solubility, the polymers may contain corresponding groups. It may preferably be provided that the polymers contain substituents, so that on average at least 2 non-aromatic carbon atoms, particularly preferably at least 4 and especially preferably at least 8 non-aromatic carbon atoms are present per recurring unit, where the average relates to the number average. Individual carbon atoms here may be replaced, for example, by O or S. However, it is possible for a certain proportion, optionally all recurring units, to contain no substituents which contain non-aromatic carbon atoms. Short-chain substituents are preferred here, since long-chain substituents can have adverse effects on layers which can be obtained using organofunctional materials. The substituents preferably contain at most 12 carbon atoms, preferably at most 8 carbon atoms and particularly preferably at most 6 carbon atoms in a linear chain.

The polymer employed in accordance with the invention as organofunctional material can be a random, alternating or regioregular copolymer, a block copolymer or a combination of these copolymer forms.

In a further embodiment, the polymer employed as organofunctional material can be a non-conjugated polymer having side chains, where this embodiment is particularly important for phosphorescent OLEDs based on polymers. In general, phosphorescent polymers can be obtained by free-radical copolymerisation of vinyl compounds, where these vinyl compounds contain at least one unit having a phosphorescent emitter and/or at least one charge-transport unit, as is disclosed, inter alia, in U.S. Pat. No. 7,250,226 B2. Further phosphorescent polymers are described, inter alia, in JP 2007/211243 A2, JP 2007/197574 A2, U.S. Pat. No. 7,250,226 B2 and JP 2007/059939 A.

In a further preferred embodiment, the non-conjugated polymers contain backbone units, which are connected to one another by spacer units. Examples of such triplet emitters which are based on non-conjugated polymers based on backbone units are disclosed, for example, in DE 102009023154.

In a further preferred embodiment, the non-conjugated polymer can be designed as fluorescent emitter. Preferred fluorescent emitters which are based on non-conjugated polymers having side chains contain anthracene or benzanthracene groups or derivatives of these groups in the side chain, where these polymers are disclosed, for example, in JP 2005/108556, JP 2005/285661 and JP 2003/338375.

These polymers can frequently be employed as electron- or hole-transport materials, where these polymers are preferably designed as non-conjugated polymers.

Furthermore, the functional compounds employed as organofunctional materials in the formulations preferably have, in the case of polymeric compounds, a molecular weight $M_w$ of ≥10,000 g/mol, particularly preferably ≥20,000 g/mol and especially preferably ≥50,000 g/mol.

The molecular weight $M_w$ of the polymers here is preferably in the range from 10,000 to 2,000,000 g/mol, particularly preferably in the range from 20,000 to 1,000,000 g/mol and very particularly preferably in the range from 50,000 to 300,000 g/mol. The molecular weight $M_w$ is determined by means of GPC (=gel permeation chromatography) against an internal polystyrene standard.

The publications cited above for description of the functional compounds are incorporated into the present application by way of reference for disclosure purposes.

The formulations according to the invention may comprise all organofunctional materials which are necessary for the production of the respective functional layer of the electronic device. If, for example, a hole-transport, hole-injection, electron-transport or electron-injection layer is built up precisely from one functional compound, the formulation comprises precisely this compound as organofunctional material. If an emission layer comprises, for example, an emitter in combination with a matrix or host material, the formulation comprises, as organofunctional material, precisely the mixture of emitter and matrix or host material, as described in greater detail elsewhere in the present application.

The proportion of organofunctional material which can be employed for the production of functional layers of electronic devices in the formulation is preferably in the range from 0.1 to 20% by weight, particularly preferably in the range from 0.3 to 10% by weight and especially preferably in the range from 0.5 to 5% by weight, based on the total weight of the formulation.

Besides the said components, the formulation according to the invention may comprise further additives and processing assistants. These include, inter alia, surface-active substances, surfactants, lubricants and greases, additives which increase the conductivity, dispersants, hydrophobicising agents, adhesion promoters, flow improvers, antifoams, deaerating agents, diluents, which may be reactive or unreactive, fillers, assistants, processing assistants, dyes, pigments, stabilisers, sensitisers, nanoparticles and inhibitors.

In a particular embodiment of the present invention, the formulations may comprise solvents which differ from the compounds of the formula (1) or (2). These solvents can also be employed as co-solvents together with the compounds of the formula (1) or (2).

Suitable solvents, preferably organic solvents, include, inter alia, ketones, esters, amides, sulfur compounds, nitro compounds, halogenated hydrocarbons and hydrocarbons.

Aromatic and heteroaromatic hydrocarbons, di-$C_{1-2}$-alkylformamides and chlorinated hydrocarbons are preferred organic solvents.

Particularly preferred organic solvents are, for example, 1,2,3,4-tetramethylbenzene, 1,2,3,5-tetramethylbenzene, 1,2,3-trimethylbenzene, 1,2,4,5-tetramethylbenzene, 1,2,4-trichlorobenzene, 1,2,4-trimethylbenzene, 1,2-dihydronaphthalene, 1,2-dimethylnaphthalene, 1,3-benzodioxolane, 1,3-diisopropylbenzene, 1,3-dimethylnaphthalene, 1,4-benzodioxane, 1,4-diisopropylbenzene, 1,4-dimethylnaphthalene, 1,5-dimethyltetralin, 1-benzothiophene, thianaphthalene, 1-bromonaphthalene, 1-chloromethylnaphthalene, 1-ethylnaphthalene, 1-methoxynaphthalene, 1-methylnaphthalene, 1-methylindole, 2,3-benzofuran, 2,3-dihydrobenzofuran, 2,3-dimethylanisole, 2,4-dimethylanisole, 2,5-dimethylanisole, 2,6-dimethylanisole, 2,6-dimethylnaphthalene, 2-bromo-3-bromomethylnaphthalene, 2-bromomethylnaphthalene, 2-bromonaphthalene, 2-ethoxynaphthalene, 2-ethylnaphthalene, 2-isopropylanisole, 2-methylanisole, 2-methylindole, 3,4-dimethylanisole, 3,5-dimethylanisole, 3-bromoquinoline, 3-methylanisole, 4-methylanisole, 5-decanolide, 5-methoxyindane, 5-methoxyindole, 5-tert-butyl-m-xylene, 6-methylquinoline, 8-methylquinoline, acetophenone, anisole, benzonitrile, benzothiazole, benzyl acetate, bromobenzene, butyl benzoate, butyl phenyl ether, cyclohexylbenzene, decahydronaphthol, dimethoxytoluene, diphenyl ether, propiophenone, ethylbenzene, ethyl benzoate, γ-terpine, hexylbenzene, indane, indene, isochroman, cumene, m-cymene, mesitylene, methyl benzoate, o-, m-, p-xylene, propyl benzoate, propylbenzene, o-dichlorobenzene, pentyl-benzene, phenetol, ethoxybenzene, phenyl acetate, p-cymene, propiophenone, sec-butylbenzene, t-butylbenzene, thiophene, toluene, veratrol, monochlorobenzene, o-dichlorobenzene, pyridine, pyrazine, pyrimidine, pyrrolidinone, morpholine, dimethylacetamide, dimethyl sulfoxide, decalin and/or mixtures of these compounds.

The solvents can be employed individually or as a mixture of two, three or more compounds.

The present invention furthermore relates to a process for the preparation of a formulation according to the invention by mixing a compound of one of the formulae (1) and (2) with an organofunctional material which can be employed for the production of functional layers of electronic devices.

A formulation in accordance with the present invention can be employed for the production of a layer or multilayered structure in which the organofunctional materials are present in layers, as are required for the production of preferred electronic or opto-electronic components, such as OLEDs.

The formulation of the present invention can preferably be employed for the formation of functional layers on a substrate or one of the layers applied to the substrate.

The present invention likewise relates to a process for the production of an electronic device in which a formulation according to the invention is applied to a substrate and dried.

The functional layers can be produced, for example, by flood coating, dip coating, spray coating, spin coating, screen printing, relief printing, gravure printing, rotary printing, roller coating, flexographic printing, offset printing or nozzle printing, preferably ink-jet printing on a substrate or one of the layers applied to the substrate.

After the application of a formulation according to the invention to a substrate or a functional layer already applied, a drying step can be carried out in order to remove the solvent from the continuous phase described above. The drying can preferably be carried out at relatively low temperature and over a relatively long period in order to avoid bubble formation and to obtain a uniform coating. The drying can preferably be carried out at a temperature in the range from 80 to 300° C., particularly preferably 150 to 250° C. and especially preferably 180 to 200° C. The drying here can preferably be carried out at a pressure in the range from $10^{-6}$ mbar to 2 bar, particularly preferably in the range from $10^{-2}$ mbar to 1 bar and especially preferably in the range from $10^{-1}$ mbar to 100 mbar. The duration of the drying depends on the degree of drying to be achieved, where small amounts of water can optionally be removed at relatively high temperature and in combination with sintering, which is preferably to be carried out.

It may furthermore be provided that the process is repeated a number of times, with formation of different or identical functional layers. Crosslinking of the functional layer formed can take place here in order to prevent dissolution thereof, as is disclosed, for example, in EP 0 637 899 A1.

The present invention also relates to an electronic device obtainable by a process for the production of an electronic device.

The present invention furthermore relates to an electronic device having at least one functional layer comprising at least one organofunctional material and at least one aromatic compound having a structure of the formula (1) or (2).

An electronic device is taken to mean a device which comprises anode, cathode and at least one functional layer in between, where this functional layer comprises at least one organic or organometallic compound.

The organic, electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic, light-emitting transistor (O-LET), an organic solar cell (O-SC), an organic, optical detector, an organic photoreceptor, an organic field-quench device (O-FQD), an organic electrical sensor, a light-emitting electrochemical cell (LEC) or an organic laser diode (O-laser).

Active components are generally the organic or inorganic materials which are introduced between the anode and the cathode, where these active components effect, maintain and/or improve the properties of the electronic device, for example its performance and/or its lifetime, for example charge-injection, charge-transport or charge-blocking materials, but in particular emission materials and matrix materials. The organofunctional material which can be employed for the production of functional layers of electronic devices accordingly preferably comprises an active component of the electronic device.

Organic electroluminescent devices are a preferred embodiment of the present invention. The organic electroluminescent device comprises a cathode, an anode and at least one emitting layer.

It is furthermore preferred to employ a mixture of two or more triplet emitters together with a matrix. The triplet emitter having the shorter-wave emission spectrum serves as co-matrix here for the triplet emitter having the longer-wave emission spectrum.

The proportion of the matrix material in the emitting layer in this case is preferably between 50 and 99.9% by vol., particularly preferably between 80 and 99.5% by vol. and especially preferably between 92 and 99.5% by vol. for fluorescent emitting layers and between 85 and 97% by vol. for phosphorescent emitting layers.

Correspondingly, the proportion of the dopant is preferably between 0.1 and 50% by vol., particularly preferably between 0.5 and 20% by vol. and especially preferably between 0.5 and 8% by vol. for fluorescent emitting layers and between 3 and 15% by vol. for phosphorescent emitting layers.

An emitting layer of an organic electroluminescent device may also encompass systems which comprise a plurality of matrix materials (mixed-matrix systems) and/or a plurality of dopants. In this case too, the dopants are generally the materials whose proportion in the system is the smaller and the matrix materials are the materials whose proportion in the system is the greater. In individual cases, however, the proportion of an individual matrix material in the system may be smaller than the proportion of an individual dopant.

The mixed-matrix systems preferably comprise two or three different matrix materials, particularly preferably two different matrix materials. One of the two materials here is preferably a material having hole-transporting properties and the other material is a material having electron-transporting properties. However, the desired electron-transporting and hole-transporting properties of the mixed-matrix components may also be combined principally or completely in a single mixed-matrix component, where the further mixed-matrix component(s) fulfil(s) other functions. The two different matrix materials may be present here in a ratio of 1:50 to 1:1, preferably 1:20 to 1:1, particularly preferably 1:10 to 1:1 and especially preferably 1:4 to 1:1. Mixed-matrix systems are preferably employed in phosphorescent organic electroluminescent devices. Further details on mixed-matrix systems can be found, for example, in WO 2010/108579.

Apart from these layers, an organic electroluminescent device may also comprise further layers, for example in each case one or more hole-injection layers, hole-transport layers, hole-blocking layers, electron-transport layers, electron-injection layers, exciton-blocking layers, electron-blocking layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. It is possible here for one or more hole-transport layers to be p-doped, for example with metal oxides, such as $MoO_3$ or $WO_3$, or with (per) fluorinated electron-deficient aromatic compounds, and/or for one or more electron-transport layers to be n-doped. It is likewise possible for interlayers, which have, for example, an exciton-blocking function and/or control the charge balance in the electroluminescent device, to be introduced between two emitting layers. However, it should be pointed out that each of these layers does not necessarily have to be present. These layers may likewise be present on use of the formulations according to the invention, as defined above.

The present invention thus also relates to a layer, in particular an organic layer, comprising one or more surface-active polymers, as defined above.

In a further embodiment, the device comprises a plurality of layers. The formulation according to the invention can preferably be employed here for the production of a hole-transport, hole-injection, electron-transport, electron-injection and/or emission layer.

The present invention accordingly also relates to an electronic device which comprises at least three layers, but in a preferred embodiment all said layers, from hole-injection, hole-transport, emission, electron-transport, electron-injection, charge-blocking and/or charge-generation layer and in which at least one layer has been obtained by means of a formulation to be employed in accordance with the invention. The thickness of the layers, for example the hole-transport and/or hole-injection layer, can preferably be in the range from 1 to 500 nm, particularly preferably in the range from 2 to 200 nm.

The device may furthermore comprise layers built up from further low-molecular-weight compounds or polymers which have not been applied by the use of formulations according to the invention. These can also be produced by evaporation of low-molecular-weight compounds in a high vacuum.

It may additionally be preferred to use the compounds to be employed not as the pure substance, but instead as a mixture (blend) together with further polymeric, oligomeric, dendritic or low-molecular-weight substances of any desired type. These may, for example, improve the electronic properties or themselves emit.

In a preferred embodiment of the present invention, the formulations according to the invention comprise organofunctional materials which are employed as host materials or matrix materials in an emitting layer. The formulation here may comprise the emitters described above in addition to the host materials or matrix materials. The organic electroluminescent device here may comprise one or more emitting layers. If a plurality of emission layers are present, these preferably have a plurality of emission maxima between 380 nm and 750 nm, resulting overall in white emission, i.e. various emitting compounds which are able to fluoresce or phosphoresce are used in the emitting layers. Very particular preference is given to three-layer systems, where the three layers exhibit blue, green and orange or red emission (for the basic structure see, for example, WO 2005/011013). White-emitting devices are suitable, for example, as backlighting of LCD displays or for general lighting applications.

It is also possible for a plurality of OLEDs to be arranged one above the other, enabling a further increase in efficiency with respect to the light yield to be achieved.

In order to improve the coupling-out of light, the final organic layer on the light-exit side in OLEDs can, for example, also be in the form of a nano-foam, resulting in a reduction in the proportion of total reflection.

Preference is furthermore given to an organic electroluminescent device in which one or more layers are applied by means of a sublimation process, in which the materials are applied by vapour deposition in vacuum sublimation units at a pressure below $10^{-5}$ mbar, preferably below $10^{-6}$ mbar, particularly preferably below $10^{-7}$ mbar.

It may furthermore be provided that one or more layers of an electronic device according to the invention are applied by means of the OVPD (organic vapour phase deposition) process or with the aid of carrier-gas sublimation, in which the materials are applied at a pressure between $10^{-5}$ mbar and 1 bar.

It may furthermore be provided that one or more layers of an electronic device according to the invention are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing.

These layers may also be applied by a process in which no compound of the formula (1) or (2) is employed. An orthogonal solvent can preferably be used here, which, although dissolving the functional material of a layer to be applied, does not dissolve the layer to which the functional material is applied.

The device usually comprises a cathode and an anode (electrodes). The electrodes (cathode, anode) are selected for the purposes of the present invention in such a way that their band energies correspond as closely as possible to those of the adjacent, organic layers in order to ensure highly efficient electron or hole injection.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali-metal or alkaline-earth metal fluorides, but also the corresponding oxides (for example LiF, $Li_2O$, $BaF_2$, MgO, NaF, etc.). The layer thickness of this layer is preferably between 0.1 and 10 nm, particularly preferably between 0.2 and 8 nm, especially preferably between 0.5 and 5 nm.

The anode preferably comprises materials having a high work function. The anode preferably has a potential greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to facilitate either irradiation of the organic material (O-SCs) or the coupling-out of light (OLEDs/PLEDs, O-lasers). A preferred structure uses a transparent anode. Preferred anode materials here are conductive, mixed metal oxides. Particular preference is given to indium tin oxide (ITO) or indium zinc oxide (IZO). Preference is furthermore given to conductive, doped organic materials, in particular conductive, doped polymers, such as, for example, poly(ethylenedioxythiophene) (PEDOT) and polyaniline (PANI) or derivatives of these polymers. It is furthermore preferred for a p-doped hole-transport material to be applied as hole-injection layer to the anode, where suitable p-dopants are metal oxides, for example $MoO_3$ or $WO_3$, or (per)fluorinated electron-deficient aromatic compounds. Further suitable p-dopants are HAT-CN (hexacyanohexaazatriphenylene) or the compound NPD9 from Novaled. A layer of this type simplifies hole injection in materials having a low HOMO, i.e. an HOMO with a large value.

In general, all materials as are used for the layers in accordance with the prior art can be used in the further layers, and the person skilled in the art will be able to combine each of these materials with the materials according to the invention in an electronic device without inventive step.

The device is correspondingly structured in a manner known per se, depending on the application, provided with contacts and finally hermetically sealed, since the lifetime of such devices is drastically shortened in the presence of water and/or air.

The formulations according to the invention and the electronic devices, in particular organic electroluminescent devices, obtainable therefrom are distinguished over the prior art by one or more of the following surprising advantages:

1. The electronic devices obtainable using the formulations according to the invention exhibit very high stability and a very long lifetime compared with electronic devices obtained using conventional methods.
2. The formulations according to the invention can be processed using conventional methods, so that cost advantages can also be achieved thereby.
3. The organofunctional materials employed in the formulations according to the invention are not subject to any particular restrictions, enabling the process of the present invention to be employed comprehensively.
4. The coatings obtainable using the formulations of the present invention exhibit excellent quality, in particular with respect to the uniformity of the coating.

These above-mentioned advantages are not accompanied by an impairment of the other electronic properties.

It should be pointed out that variations of the embodiments described in the present invention fall within the scope of this invention. Each feature disclosed in the present invention can, unless this is explicitly excluded, be replaced by alternative features which serve the same, an equivalent or a similar purpose. Thus, each feature disclosed in the present invention is, unless stated otherwise, to be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should be furthermore be pointed out that many of the features, and in particular those of the preferred embodiments of the present invention, are themselves inventive and are not to be regarded merely as part of the embodiments of the present invention. For these features, independent protection can be sought in addition or as an alternative to each invention presently claimed.

The teaching on technical action disclosed with the present invention can be abstracted and combined with other examples.

The invention is explained in greater detail below with reference to working examples, but without being restricted thereby.

The person skilled in the art will be able to use the descriptions to produce further electronic devices according to the invention without inventive step and thus carry out the invention throughout the range claimed.

WORKING EXAMPLES

For the tests, five OLED components having the layer sequence described in FIG. 1 are produced. The solvent of the formulation for the emitter layer (G-EML) is varied here. 3-Phenoxytoluene is used for the reference component, a mixture of hexamethylindane (HMI) and butyl benzoate (BB) in the mixing ratio 60:40 (ratio by weight) is used for Example 1, a mixture of HMI and BB in the ratio 50:50 is used for Example 2, a mixture of HMI and cyclohexylbenzene (CHB) in the ratio 50:50 is used for Example 3, and a mixture of HMI and CHB in the ratio 60:40 is used for Example 4. Table 1 summarises the concentration, viscosity and surface tension of the formulations used.

TABLE 1

Measurement values of the formulations used for the emitter layer

| Layer | Formulation | Conc. (g/l) | Viscosity (mPas) | Surface tension (mN/m) |
|---|---|---|---|---|
| G-EML | Reference | 14 | 4.8 | 37.6 |
| G-EML | Example 1 | 14 | 5.7 | 30.6 |
| G-EML | Example 2 | 14 | 5.5 | 30.9 |
| G-EML | Example 3 | 14 | 4.7 | 31.5 |
| G-EML | Example 4 | 14 | 5.5 | 31.4 |

Measurement of the Viscosity and Surface Tension

The viscosity of the formulations used is measured using a rheometer with cone-and-plate measurement geometry. The viscosities indicated in Table 1 are determined at a temperature of 23.4° C. and a shear rate of 500 s$^{-1}$.

The surface tension is determined by means of an optical method (pendant drop). In this measurement method, the surface tension of the liquid is calculated from the deformation of a hanging drop due to gravity. The surface tension is measured at room temperature, usually in the range from 22° C. to 24° C.

Production of the Test Components:

In a clean room, glass substrates coated with ITO and a bank structure are cleaned in an ultrasound bath using DI water, dried and subsequently subjected to a plasma treatment (oxygen plasma for 5 s, followed by $CF_4$ plasma for 40 s). An 80 nm layer of PEDOT (PEDOT is a polythiophene derivative (Baytron PJET HC V2) from H. C. Starck, Goslar, which is supplied as an aqueous dispersion) is then applied, likewise in the clean room, by ink-jet printing. In order to remove residual water from the layer, the substrates are dried by heating on a hotplate at 180° C. for 10 minutes. 20 nm of an interlayer (typically a hole-dominated polymer, here HL-X026 from Merck) are then applied from mesitylene solution (concentration 5 g/l) under an inert-gas atmosphere (nitrogen or argon). The layer is dried by heating at 180° C.

for at least 60 minutes. The emission layer (G-EML) is subsequently applied to the hole-transport layer by means of ink-jet printing, dried in vacuo and subsequently dried by heating on a hotplate at 160° C. for 10 minutes.

The emission layer here consists of the following three materials TH-1, TH-2 and TE-1, which are employed in the ratio 40:40:20, more precisely in a concentration of 14 g/l, based on the respective solvent mixture. The thickness of the emission layer is 60 nm.

The substrates printed in this way are then transferred into a vacuum vapour-deposition chamber, where a 20 nm thick electron-transport layer (ETL) comprising the two following materials ETM-1 and ETM-2 in the ratio 50:50 is applied by thermal co-evaporation.

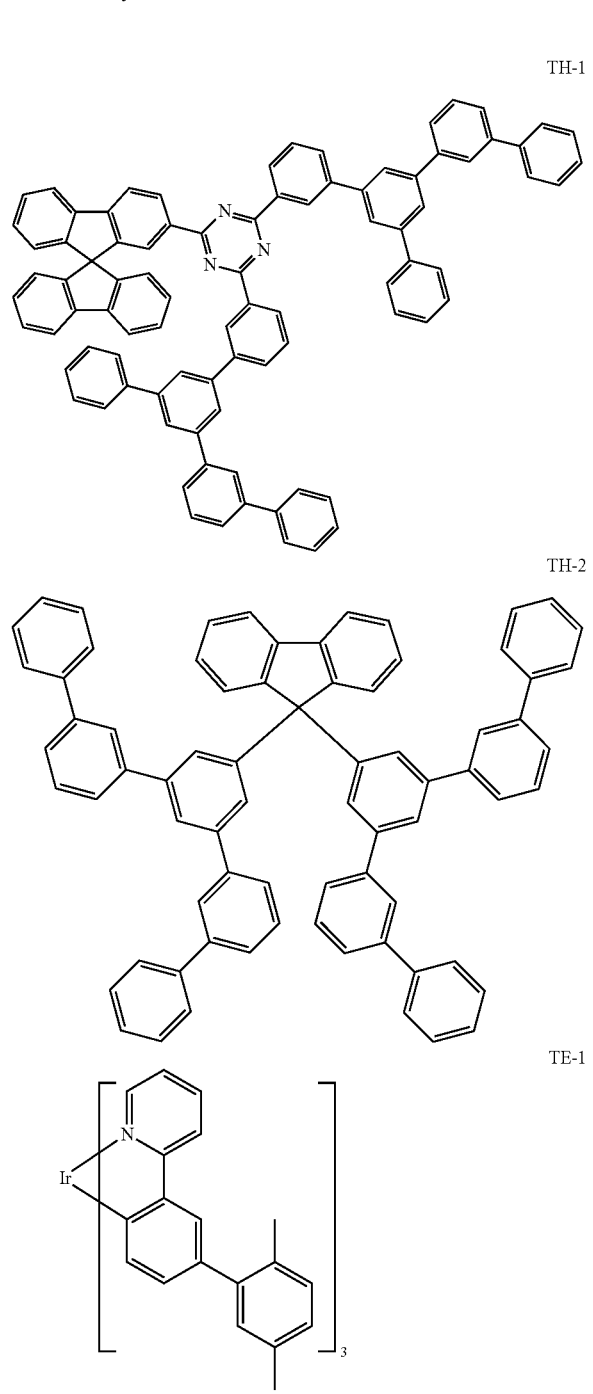

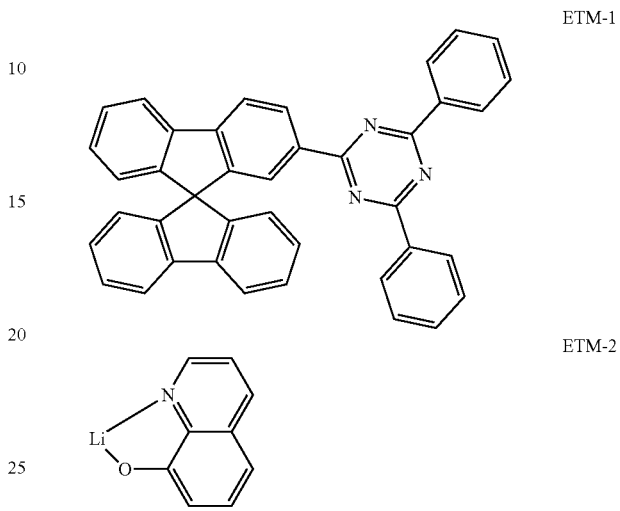

The Al cathode is then applied by vapour deposition through a vapour-deposition mask; vapour-deposition units from Lesker or others, typical vacuum level $5 \times 10^{-6}$ mbar. In order to protect, in particular, the cathode against air and atmospheric moisture, the device is finally encapsulated and then characterised.

Measurement Results and Discussion:

Table 2 shows in the 'Efficiency' column that an efficiency of 46.9 cd/A is achieved at a luminance of 1000 cd/m² for the reference component, an efficiency of 48.0 cd/A is achieved for the component in accordance with Example 1, an efficiency of 48.1 cd/A is achieved for the component in accordance with Example 2, an efficiency of 47.5 cd/A is achieved for the component in accordance with Example 3, and an efficiency of 48.1 cd/A is achieved for the component in accordance with Example 4.

Table 2 shows in the 'EQE' column that an external quantum efficiency (EQE) of 12.7% is achieved at a luminance of 1000 cd/m² for the reference component, an EQE of 13.2% is achieved for the component in accordance with Example 1, an EQE of 13.3% is achieved for the component in accordance with Example 2, an EQE of 12.8% is achieved for the component in accordance with Example 3, and an EQE of 13.3% is achieved for the component in accordance with Example 4.

It can be seen from Table 2, column 'U', that an operating voltage of 7.2 V is required at a luminance of 1000 cd/m² for the reference component, an operating voltage of 6.8 V is required for the component in accordance with Example 1, an operating voltage of 6.5 V is required for the component in accordance with Example 2, an operating voltage of 6.9 V is required for the component in accordance with Example 3, and an operating voltage of 6.9 V is required for the component in accordance with Example 4.

The lifetime data for the components produced are shown by Table 2, column 'LT80'. No significant difference is evident in the lifetime characteristic lines between the reference component and the components produced in accordance with Examples 1 to 4. It can be deduced from All ink-jet printing operations are carried out in air, as is the drying of the hole-injection layer by heating. The drying of the hole-transport layer and emitter layer by heating is carried out under inert gas (N₂) in a glove box.

this that the use of the solvent system according to the invention does not result in impairment of the components and the use of the solvent system according to the invention does not have an adverse effect on the electro-optical performance of the components produced and their lifetime. However, the solvent system according to the invention results in greater flexibility being achieved with respect to the viscosity and the surface tension of the formulations to be used, which opens up a larger process window for meeting the requirements of different ink-jet printing machines.

TABLE 2

Measurement values of the test components produced

| Formulation | Efficiency (cd/A) at 1000 cd/m² | EQE (%) | U (V) | LT$_{80}$ (h) at 8000 cd/m² |
|---|---|---|---|---|
| Reference | 46.9 | 12.7 | 7.2 | 59 |
| Example 1 | 48.0 | 13.2 | 6.8 | 53 |
| Example 2 | 48.1 | 13.3 | 6.5 | 52 |
| Example 3 | 47.5 | 12.8 | 6.9 | 39 |
| Example 4 | 48.1 | 13.0 | 6.9 | 46 |

In a further test series, the influence of the use of isobenzofuran as additive on the properties of formulations, such as, for example, the surface tension and the viscosity, is investigated. To this end, two formulations are prepared with different proportions of additive. The formulation in accordance with Example 5 comprises a proportion of 5% by weight of isobenzofuran in 3-PT as solvent, the formulation in accordance with Example 6 comprises a proportion of 10% by weight of isobenzofuran in 3-PT as solvent.

TABLE 3

Measurement values of the test formulations

| Layer | Formulation | Proportion of additive (% by wt.) | Conc. (g/l) | Viscosity (mPas) | Surface tension (mN/m) |
|---|---|---|---|---|---|
| G-EML | Reference | 0 | 14 | 4.8 | 37.6 |
| G-EML | Example 5 | 5 | 14 | 4.8 | 36.9 |
| G-EML | Example 6 | 10 | 14 | 4.8 | 36.4 |

It can be seen from Table 3, column 'Viscosity', that the viscosity of the formulation is not influenced by addition of different proportions of isobenzofuran. However, it can be seen from Table 3, column 'Surface tension', that the surface tension of the formulation prepared can be influenced by the addition of different proportions of additive. The use of isobenzofuran as additive in a formulation thus gives rise to the possibility of influencing the wetting ability of the formulation in accordance with the requirements of the coating method selected, without changing the rheological properties of the formulation.

The invention claimed is:

1. A formulation comprising at least one organofunctional material which can be employed for the production of functional layers of electronic devices, and at least one aromatic compound having a structure of the formula (1) or (2)

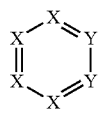

formula (1)

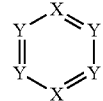

formula (2)

where the following applies to the symbols used:

X is on each occurrence, identically or differently, CR or N, where in total at most 2 radicals X stand for N;

R is on each occurrence, identically or differently, H, D, F, N(R$^1$)$_2$, CN, NO$_2$, C(=O)N(R$^1$)$_2$, Si(R$^1$)$_3$, C(=O)R$^1$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals R$^1$, where one or more non-adjacent CH$_2$ groups is optionally replaced by R$^1$C=CR$^1$, C≡C Si(R$^1$)$_2$, C=O, NR$^1$, O, S or CONR$^1$ and where one or more H atoms is optionally replaced by D, F, NO$_2$ or CN, or an aromatic or heteroaromatic ring system having 5 to 60 aromatic ring atoms, which may in each case be substituted by one or more radicals R$^1$, or an aryloxy or heteroaryloxy group having 5 to 40 aromatic ring atoms, which is optionally substituted by one or more radicals R$^1$, or an aralkyl or heteroaralkyl group having 5 to 40 aromatic ring atoms, which is optionally substituted by one or more radicals R$^1$, or a diarylamino group, diheteroarylamino group or arylheteroarylamino group having 10 to 40 aromatic ring atoms, which is optionally substituted by one or more radicals R$^1$; two adjacent radicals R here may also form a mono- or polycyclic, aliphatic, aromatic or heteroaromatic ring system with one another;

R$^1$ is on each occurrence, identically or differently, H, D, F, N(R$^2$)$_2$, CN, NO$_2$, Si(R$^2$)$_3$, C(=O)R$^2$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals R$^2$, where one or more non-adjacent CH$_2$ groups is optionally replaced by R$^2$C=CR$^2$, C≡C, Si(R$^2$)$_2$, C=O, NR$^2$, O, S or CONR$^2$ and where one or more H atoms is optionally replaced by D, F, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 40 aromatic ring atoms, which is optionally substituted by one or more radicals R$^2$, or an aralkyl or heteroaralkyl group having 5 to 40 aromatic ring atoms, which is optionally substituted by one or more radicals R$^2$, or a diarylamino group, diheteroarylamino group or arylheteroarylamino group having 10 to 40 aromatic ring atoms, which is optionally substituted by one or more radicals R$^2$; two or more adjacent radicals R$^1$ with one another or R$^1$ with R here may form a mono- or polycyclic, aliphatic, aromatic or heteroaromatic ring system;

R$^2$ is on each occurrence, identically or differently, H, D, F or an aliphatic, aromatic and/or heteroaromatic hydrocarbon radical having 1 to 20 C atoms, in which, in addition, one or more H atoms is optionally replaced by F; two or more substituents $R^2$ here may also form a mono- or polycyclic, aliphatic ring system with one another;

Y is on each occurrence, identically or differently, a group CR, wherein the adjacent groups Y in the structure of the formula (1) or (2) together form a ring of one of the following formulae (3), (4), (5), (6), (7), (8) and (9):

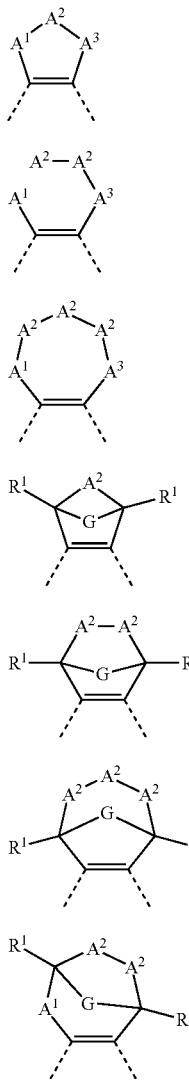

where $R^1$ has the meaning given above, the dashed lines represent the bonds from the two carbon atoms of group Y to the radicals X of the aromatic or heteroaromatic ring in the structure of the formula (1) or formula (2), and furthermore:

$A^1$, $A^3$ are, identically or differently on each occurrence, $C(R^3)_2$, O, S, $NR^3$ or C(=O);

$A^2$ is $C(R^1)_2$, O, S, $NR^3$ or C(=O);

G is an alkylene group having 1, 2 or 3 C atoms, which is optionally substituted by one or more radicals $R^2$, or is —$CR^2$=$CR^2$— or an ortho-linked arylene or heteroarylene group having 5 to 14 aromatic ring atoms, which is optionally substituted by one or more radicals $R^2$;

$R^3$ is, identically or differently on each occurrence, F, a straight-chain alkyl or alkoxy group having 1 to 10 C atoms, a branched or cyclic alkyl or alkoxy group having 3 to 10 C atoms, each of which is optionally substituted by one or more radicals $R^2$, where one or more non-adjacent $CH_2$ groups is optionally replaced by $R^2C$=$CR^2$, C≡C, $Si(R^2)_2$, C=O, $NR^2$, O, S or $CONR^2$ and where one or more H atoms is optionally replaced by D or F, or an aromatic or heteroaromatic ring system having 5 to 24 aromatic ring atoms, which may in each case be substituted by one or more radicals $R^2$, or an aryloxy or heteroaryloxy group having 5 to 24 aromatic ring atoms, which is optionally substituted by one or more radicals $R^2$, or an aralkyl or heteroaralkyl group having 5 to 24 aromatic ring atoms, which is optionally substituted by one or more radicals $R^2$; two radicals $R^3$ which are bonded to the same carbon atom may form an aliphatic or aromatic ring system with one another here and thus form a spiro system; furthermore, $R^3$ may form an aliphatic ring system with an adjacent radical R or $R^1$;

with the proviso that two identical heteroatoms in the above-mentioned groups are not bonded directly to one another and two groups C=O are not bonded directly to one another and the aromatic compound having a structure of the formula (1) or (2) is a solvent having a viscosity of at least 3 mPas and a surface tension of at most 40 mN/m wherein the organofunctional material which can be employed for the production of functional layers of electronic devices is selected from the group consisting of fluorescent emitters, phosphorescent emitters, host materials, matrix materials, electron-transport materials, exciton-blocking materials, electron-injection materials, hole-conductor materials, hole-injection materials, n-dopants, p-dopants, wide-band-gap materials, electron-blocking materials and hole-blocking materials.

2. The formulation according to claim 1, wherein the proportion of the aromatic compound having a structure of the formula (1) or (2) in the formulation is at least 0.1% by weight based on the formulation.

3. The formulation according to claim 1, wherein the proportion of the aromatic compound having a structure of the formula (1) or (2) in the formulation is at least 20% by weight based on the formulation.

4. The formulation according to claim 1, wherein the aromatic compound having a structure of the formula (1) or (2) has a boiling point of at most 300° C.

5. The formulation according to claim 1, wherein the aromatic compound having a structure of the formula (1) or (2) has a viscosity of at least 5 mPas, the proportion of the aromatic compound having a structure of the formula (1) or (2) in the formulation is at least 80% by weight, based on the formulation the aromatic compound having a structure of the formula (1) or (2) has a surface tension of at most 30 mN/m, and the aromatic compound having a structure of the formula (1) or (2) has a boiling point of at most 280° C.

6. The formulation according to claim 1, wherein, in the ring structures of one of the formulae (3), (4), (5), (6), (7), (8) or (9), at least one of the groups $A^1$ and $A^3$ stands, identically or differently, for O or $NR^3$ and $A^2$ stands for $C(R^1)_2$.

7. The formulation according to claim 1, wherein, in the ring structures of one of the formulae (3), (4), (5), (6), (7), (8) or (9), the groups $A^1$ and $A^3$ stand, identically or differently on each occurrence, for $C(R^3)_2$ and $A^2$ stands for $C(R^1)_2$.

8. The formulation according to claim 1, wherein two adjacent radicals Y in the structure of the formula (1) or formula (2) form a ring structure of one of the following formulae (3-A) to (3-F):

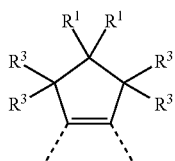

formula (3-A)

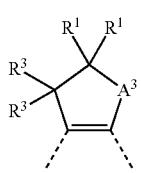

formula (3-B)

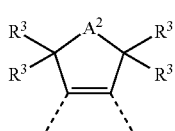

formula (3-C)

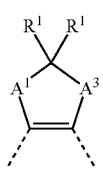

formula (3-D)

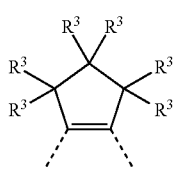

formula (3-E)

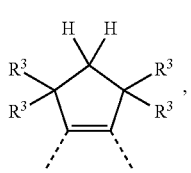

formula (3-F)

where $A^1$, $A^2$ and $A^3$ stand, identically or differently on each occurrence, for O or $NR^3$, the dashed lines represent the bonds from the two carbon atoms of group Y to the radicals X of the aromatic or heteroaromatic ring in the structure of the formula (1) or formula (2), and $R^1$ and $R^3$ have the meaning indicated in claim 1.

9. The formulation according to claim 1, wherein two adjacent radicals Y in the structure of the formula (1) or formula (2) form a ring structure of one of the following formulae (4-A) to (4-F):

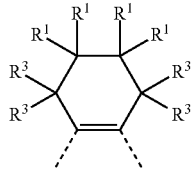

formula (4-A)

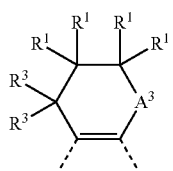

formula (4-B)

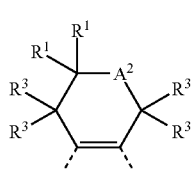

formula (4-C)

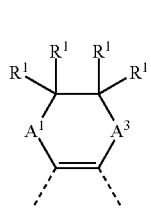

formula (4-D)

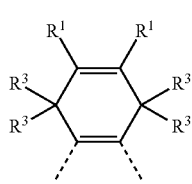

formula (4-E)

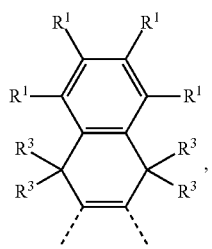

formula (4-F)

where $A^1$, $A^2$ and $A^3$ stand, identically or differently on each occurrence, for O or $NR^3$, the dashed lines represent the bonds from the two carbon atoms of group Y to the radicals X of the aromatic or heteroaromatic ring in the structure of the formula (1) or formula (2), and $R^1$ and $R^3$ have the meaning indicated in claim 1.

10. The formulation according to claim 1, wherein two adjacent radicals Y in the structure of the formula (1) or formula (2) form a ring structure of one of the following formulae (5-A) to (5-E):

formula (5-A)
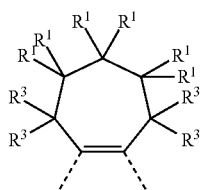

formula (5-B)
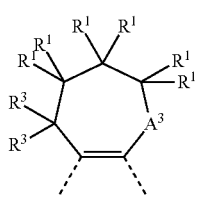

formula (5-C)
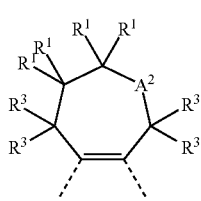

formula (5-D)
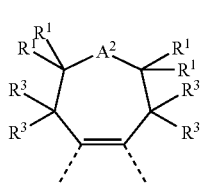

formula (5-E)
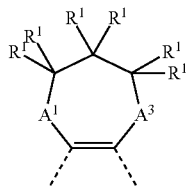

where $A^1$, $A^2$ and $A^3$ stand, identically or differently on each occurrence, for O or $NR^3$, the dashed lines represent the bonds from the two carbon atoms of group Y to the radicals X of the aromatic or heteroaromatic ring in the structure of the formula (1) or formula (2), and $R^1$ and $R^3$ have the meaning indicated in claim 1.

11. The formulation according to claim 1, wherein two adjacent radicals Y in the structure of the formula (1) or formula (2) form a ring structure of one of the following formulae (6-A) to (6-C):

formula (6-A)
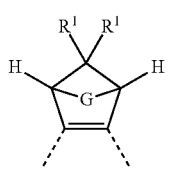

formula (6-B)
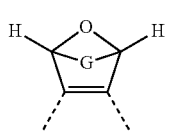

formula (6-C)
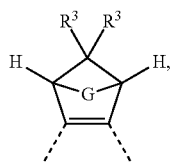

where the symbols used have the meanings indicated in claim 1, and the dashed lines represent the bonds from the two carbon atoms of group Y to the radicals X of the aromatic or heteroaromatic ring in the structure of the formula (1) or formula (2).

12. The formulation according to claim 1, wherein two adjacent radicals Y in the structure of the formula (1) or formula (2) form a ring structure of one of the following formulae (7-A), (8-A) or (9-A):

formula (7-A)
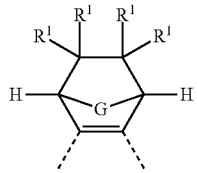

formula (8-A)
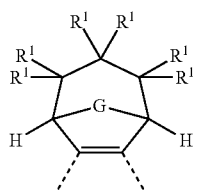

formula (9-A)
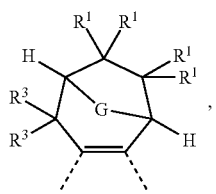

where symbols used have the meanings indicated in claim 1, and the dashed lines represent the bonds from the two carbon atoms of group Y to the radicals X of the aromatic or heteroaromatic ring in the structure of the formula (1) or formula (2).

13. The formulation according to claim 1, wherein the aromatic compound having a structure of the formula (1) or (2) is selected from compounds of the formulae (10), (11) and (12), formula (10)
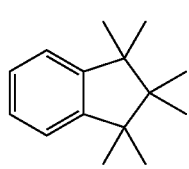

-continued

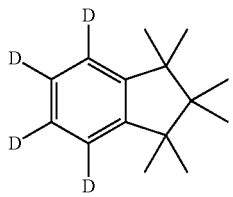

formula (11)

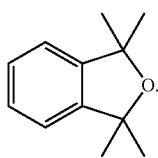

formula (12)

14. A process for the production of an electronic device comprising applying the formulation according to claim 1 to a substrate and/or to a layer applied indirectly or directly to a substrate.

15. The process according to claim 14, wherein the formulation is applied to a substrate or one of the layers applied to the substrate by flood coating, dip coating, spray coating, spin coating, screen printing, relief printing, gravure printing, rotary printing, roller coating, flexographic printing, offset printing or nozzle printing, preferably ink-jet printing.

16. An electronic device obtainable by the process according to claim 13.

17. An electronic device having at least one layer comprising at least one organofunctional material and at least one aromatic compound having a structure of the formula (1) or (2)

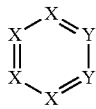

formula (1)

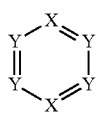

formula (2)

where the following applies to the symbols used:

X is on each occurrence, identically or differently, CR or N, where in total at most 2 radicals X stand for N;

R is on each occurrence, identically or differently, H, D, F, $N(R^1)_2$, CN, $NO_2$, $C(=O)N(R^1)_2$, $Si(R^1)_3$, $C(=O)R^1$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals $R^1$, where one or more non-adjacent $CH_2$ groups is optionally replaced by $R^1C=CR^1$, $C\equiv C$, $Si(R^1)_2$, $C=O$, $NR^1$, O, S or $CONR^1$ and where one or more H atoms is optionally replaced by D, F, $NO_2$ or CN, or an aromatic or heteroaromatic ring system having 5 to 60 aromatic ring atoms, which may in each case be substituted by one or more radicals $R^1$, or an aryloxy or heteroaryloxy group having 5 to 40 aromatic ring atoms, which is optionally substituted by one or more radicals $R^1$, or an aralkyl or heteroaralkyl group having 5 to 40 aromatic ring atoms, which is optionally substituted by one or more radicals $R^1$, or a diarylamino group, diheteroarylamino group or arylheteroarylamino group having 10 to 40 aromatic ring atoms, which is optionally substituted by one or more radicals $R^1$; two adjacent radicals R here may also form a mono- or polycyclic, aliphatic, aromatic or heteroaromatic ring system with one another;

$R^1$ is on each occurrence, identically or differently, H, D, F, $N(R^2)_2$, CN, $NO_2$, $Si(R^2)_3$, $C(=O)R^2$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which is optionally substituted by one or more radicals $R^2$, where one or more non-adjacent $CH_2$ groups is optionally replaced by $R^2C=CR^2$, $C\equiv C$, $Si(R^2)_2$, $C=O$, $NR^2$, O, S or $CONR^2$ and where one or more H atoms is optionally replaced by D, F, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 40 aromatic ring atoms, which is optionally substituted by one or more radicals $R^2$, or an aralkyl or heteroaralkyl group having 5 to 40 aromatic ring atoms, which is optionally substituted by one or more radicals $R^2$, or a diarylamino group, diheteroarylamino group or arylheteroarylamino group having 10 to 40 aromatic ring atoms, which is optionally substituted by one or more radicals $R^2$; two or more adjacent radicals $R^1$ with one another or $R^1$ with R here may form a mono- or polycyclic, aliphatic, aromatic or heteroaromatic ring system;

$R^2$ is on each occurrence, identically or differently, H, D, F or an aliphatic, aromatic and/or heteroaromatic hydrocarbon radical having 1 to 20 C atoms, in which, in addition, one or more H atoms is optionally replaced by F; two or more substituents $R^2$ here may also form a mono- or polycyclic, aliphatic ring system with one another;

Y is on each occurrence, identically or differently, a group CR, wherein the adjacent groups Y in the structure of the formula (1) or (2) together form a ring of one of the following formulae (3), (4), (5), (6), (7), (8) and (9):

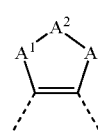

formula (3)

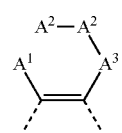

formula (4)

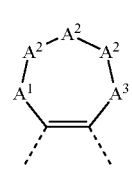

formula (5)

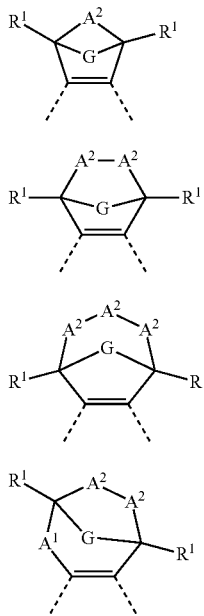

where $R^1$ has the meaning given above, the dashed lines represent the bonds from the two carbon atoms of group Y to the radicals X of the aromatic or heteroaromatic ring in the structure of the formula (1) or formula (2), and furthermore:

$A^1$, $A^3$ are, identically or differently on each occurrence, $C(R^3)_2$, O, S, $NR^3$ or C(=O);

$A^2$ is $C(R^1)_2$, O, S, $NR^3$ or C(=O);

G is an alkylene group having 1, 2 or 3 C atoms, which is optionally substituted by one or more radicals $R^2$, or is —$CR^2$=$CR^2$— or an ortho-linked arylene or heteroarylene group having 5 to 14 aromatic ring atoms, which is optionally substituted by one or more radicals $R^2$;

$R^3$ is, identically or differently on each occurrence, F, a straight-chain alkyl or alkoxy group having 1 to 10 C atoms, a branched or cyclic alkyl or alkoxy group having 3 to 10 C atoms, each of which is optionally substituted by one or more radicals $R^2$, where one or more non-adjacent $CH_2$ groups is optionally replaced by $R^2C$=$CR^2$, C≡C, $Si(R^2)_2$, C=O, $NR^2$, O, S or $CONR^2$ and where one or more H atoms is optionally replaced by D or F, or an aromatic or heteroaromatic ring system having 5 to 24 aromatic ring atoms, which may in each case be substituted by one or more radicals $R^2$, or an aryloxy or heteroaryloxy group having 5 to 24 aromatic ring atoms, which is optionally substituted by one or more radicals $R^2$, or an aralkyl or heteroaralkyl group having 5 to 24 aromatic ring atoms, which is optionally substituted by one or more radicals $R^2$; two radicals $R^3$ which are bonded to the same carbon atom may form an aliphatic or aromatic ring system with one another here and thus form a spiro system; furthermore, $R^3$ may form an aliphatic ring system with an adjacent radical R or $R^1$;

with the proviso that two identical heteroatoms in the above-mentioned groups are not bonded directly to one another and two groups C=O are not bonded directly to one another wherein the organofunctional material which can be employed for the production of functional layers of electronic devices is selected from the group consisting of fluorescent emitters, phosphorescent emitters, host materials, matrix materials, electron-transport materials, exciton-blocking materials, electron-injection materials, hole-conductor materials, hole-injection materials, n-dopants, p-dopants, wide-band-gap materials, electron-blocking materials and hole-blocking materials.

18. The electronic device according to claim 16, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electro-chemical cells and organic laser diodes.

* * * * *